United States Patent
Yaegashi et al.

(10) Patent No.: US 8,698,225 B2
(45) Date of Patent: *Apr. 15, 2014

(54) NON-VOLATILE SEMICONDUCTOR MEMORY DEVICE AND ITS MANUFACTURING METHOD

(75) Inventors: Toshitake Yaegashi, Yokohama (JP); Kazuhiro Shimizu, Yokohama (JP); Seiichi Aritome, Yokohama (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 417 days.

This patent is subject to a terminal disclaimer.

(21) Appl. No.: 13/008,735

(22) Filed: Jan. 18, 2011

(65) Prior Publication Data

US 2011/0108906 A1    May 12, 2011

Related U.S. Application Data

(60) Continuation of application No. 12/140,946, filed on Jun. 17, 2008, now Pat. No. 7,888,728, which is a continuation of application No. 11/301,736, filed on Dec. 12, 2005, now abandoned, which is a division of application No. 10/768,238, filed on Jan. 29, 2004, now Pat. No. 7,005,345, which is a division of application No. 10/429,460, filed on May 5, 2003, now Pat. No. 6,703,658, which is a continuation of application No. 10/138,849, filed on May 3, 2002, now Pat. No. 6,586,805, which is a division of application No. 09/741,261, filed on Dec. 19, 2000, now Pat. No. 6,472,701, which is a division of application No. 09/112,482, filed on Jul. 9, 1998, now Pat. No. 6,265,739.

(30) Foreign Application Priority Data

Jul. 10, 1997 (JP) .................................... 9-184863

(51) Int. Cl.
*H01L 29/788* (2006.01)

(52) U.S. Cl.
USPC .................. 257/316; 257/E29.3; 257/315

(58) Field of Classification Search
USPC .................................. 257/316, E29.3, 315
See application file for complete search history.

(56) References Cited

U.S. PATENT DOCUMENTS 4,766,088 A    8/1988  Kono et al.
5,036,018 A    7/1991  Mazzali
(Continued)

FOREIGN PATENT DOCUMENTS

JP    62-23149    7/1985
JP    62-76668    9/1985
(Continued)

OTHER PUBLICATIONS

Hannon et al., "0.25 μm Merges Bulk DRAM and SOI Logic Using Patterned SOI," 2000 Symposium on VLSI Technology Digest of Technical Papers, pp. 66-67.

(Continued)

*Primary Examiner* — Timor Karimy
(74) *Attorney, Agent, or Firm* — Oblon, Spivak, McClelland, Maier & Neustadt, L.L.P.

(57) ABSTRACT

In a non-volatile semiconductor memory device and a method for manufacturing the device, each memory cell and its select Tr have the same gate insulating film as a Vcc Tr. Further, the gate electrodes of a Vpp Tr and Vcc Tr are realized by the use of a first polysilicon layer. A material such as salicide or a metal, which differs from second polysilicon (which forms a control gate layer), may be provided on the first polysilicon layer. With the above features, a non-volatile semiconductor memory device can be manufactured by reduced steps and be operated at high speed in a reliable manner.

15 Claims, 25 Drawing Sheets

(56) References Cited

U.S. PATENT DOCUMENTS

| | | | |
|---|---|---|---|
| 5,508,957 A | * | 4/1996 | Momodomi et al. .... 365/185.17 |
| 5,600,164 A | | 2/1997 | Ajika et al. |
| 5,605,853 A | | 2/1997 | Yoo et al. |
| 5,661,052 A | | 8/1997 | Inoue et al. |
| 5,698,879 A | * | 12/1997 | Aritome et al. ............... 257/315 |
| 5,768,186 A | | 6/1998 | Ma |
| 5,824,583 A | | 10/1998 | Asano et al. |
| 5,841,174 A | | 11/1998 | Arai |
| 5,852,311 A | | 12/1998 | Kwon et al. |
| 5,913,120 A | | 6/1999 | Cappelleti |
| 5,989,957 A | | 11/1999 | Ngo et al. |
| 6,114,724 A | | 9/2000 | Ratnakumar |
| 6,127,696 A | | 10/2000 | Sery et al. |
| 6,265,739 B1 | | 7/2001 | Yaegashi et al. |

FOREIGN PATENT DOCUMENTS

| | | |
|---|---|---|
| JP | 61-201457 | 9/1986 |
| JP | 62-045165 | 2/1987 |
| JP | 02-201968 | 8/1990 |
| JP | 02-246376 | 10/1990 |
| JP | 03-19273 | 1/1991 |
| JP | 03-106076 | 5/1991 |
| JP | 03-283570 | 12/1991 |
| JP | 04-348072 | 12/1992 |
| JP | 05-183134 | 7/1993 |
| JP | 05-190811 | 7/1993 |
| JP | 05-235276 | 9/1993 |
| JP | 06-216393 | 8/1994 |
| JP | 07-074326 | 3/1995 |
| JP | 7-297304 | 3/1995 |
| JP | 7-147403 | 6/1995 |
| JP | 7-302499 | 11/1995 |
| JP | 08-23041 | 1/1996 |
| JP | 08-255828 | 10/1996 |
| JP | 08-274043 | 10/1996 |
| JP | 8-274283 | 10/1996 |
| JP | 09-148458 | 6/1997 |
| JP | 11-031799 | 2/1999 |

OTHER PUBLICATIONS

Scheuerlein et al., "A 10ns Read and Write Non-Volatile Memory Array Using a Magnetic Tunnel Junction and FET Switch in each Cell," ISSCC 2000/Session 7/TD: Emerging Memory & Device Technologies/Paper TA 7.2, pp. 128-129.

Yamada et al., "An Embedded DRAM Technology on SOI/Bulk Hybrid Substrate Formed with SEG Process for High-End SOC Application" 2002 Symposium on VLSI Technology Digest of Technical Papers, pp. 112-113.

Wolf et al., "Silicon Processing for the VLSI Era," 1986, Lattice Press, vol. 1, pp. 384-388.

Office Action dated Aug. 17, 2010, Japanese Patent Application No. 2008-137247 with English translation, pp. 1-9.

Office Action dated Nov. 30, 2010 in corresponding Japanese Patent Application No. 2008-137247 with English translation, pp. 1-8.

* cited by examiner

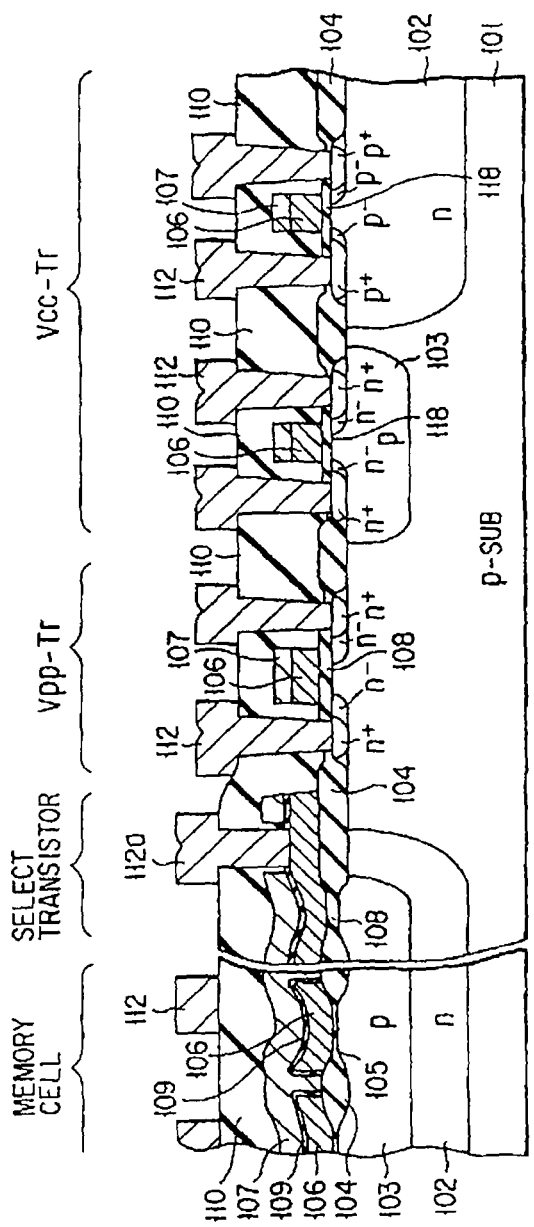
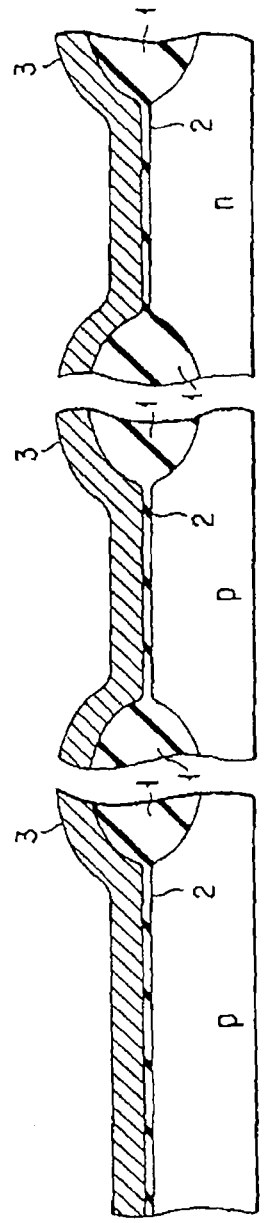
FIG. 4A
FIG. 5A  FIG. 5B  FIG. 5C

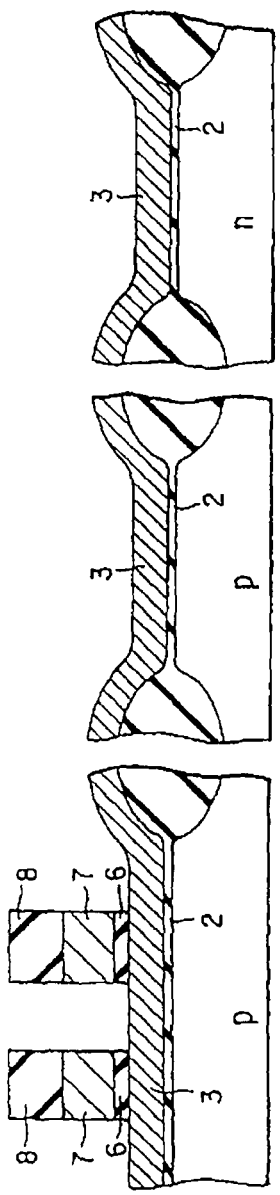
FIG. 8C
FIG. 8B
FIG. 8A
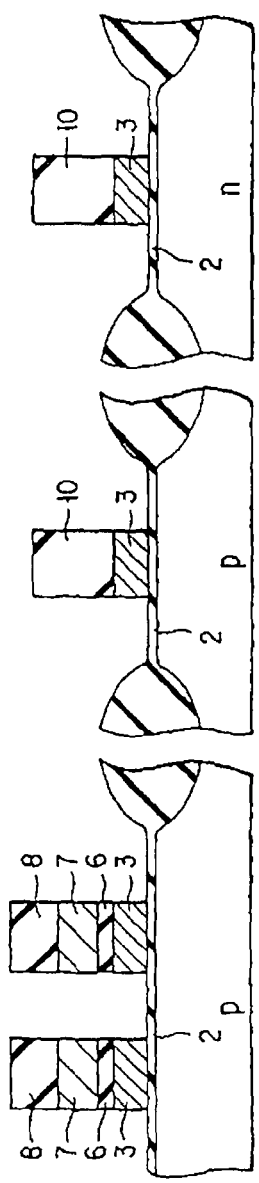
FIG. 9C
FIG. 9B
FIG. 9A

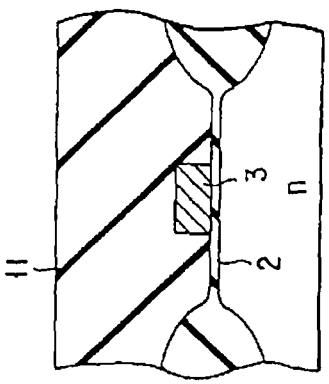
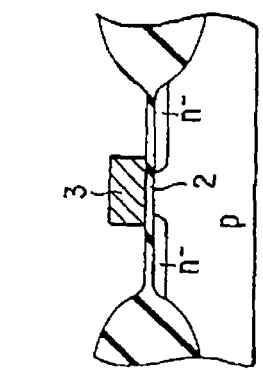
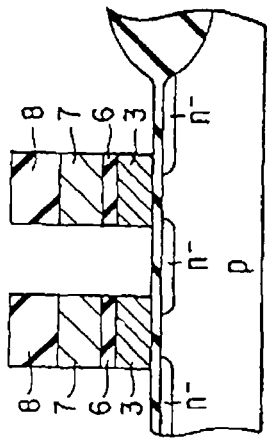
FIG. 10A
FIG. 10B
FIG. 10C
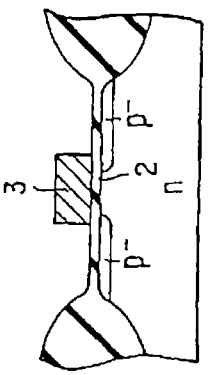
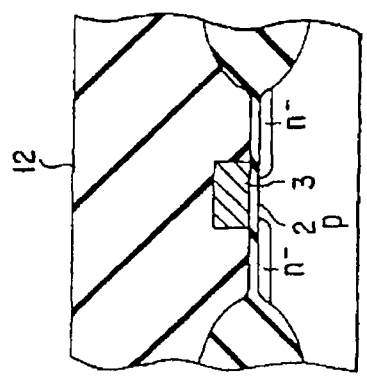
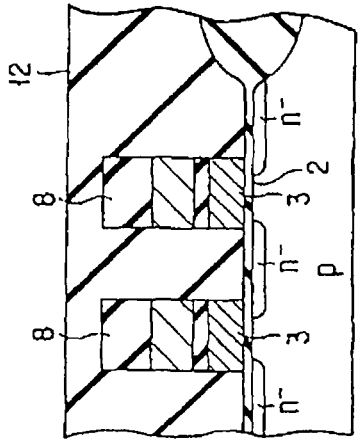
FIG. 11A
FIG. 11B
FIG. 11C

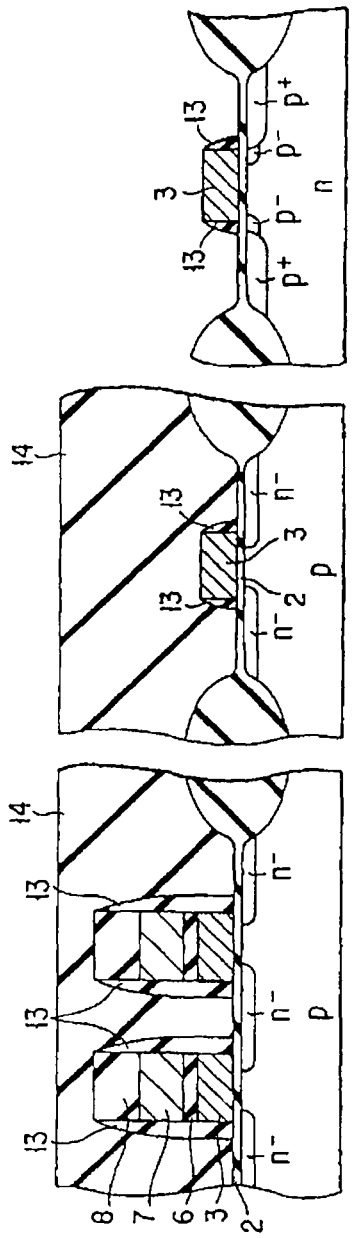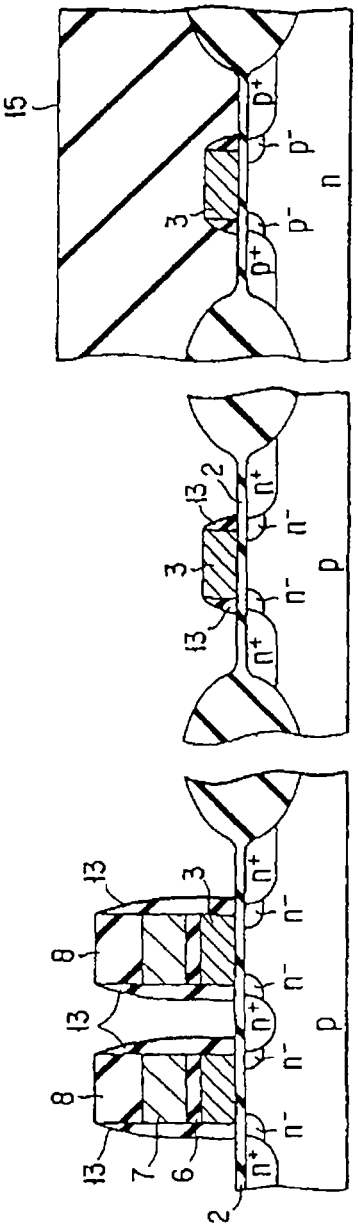

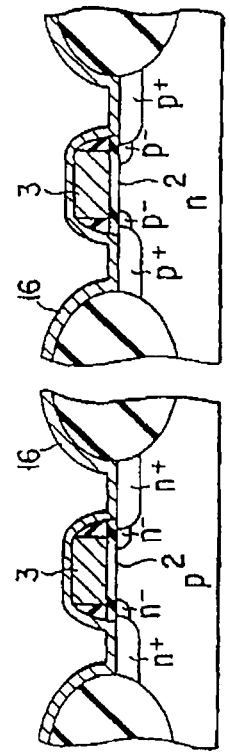 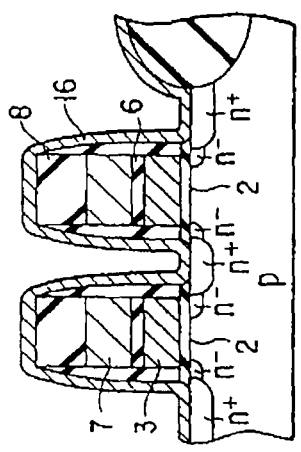
FIG. 14A  FIG. 14B  FIG. 14C
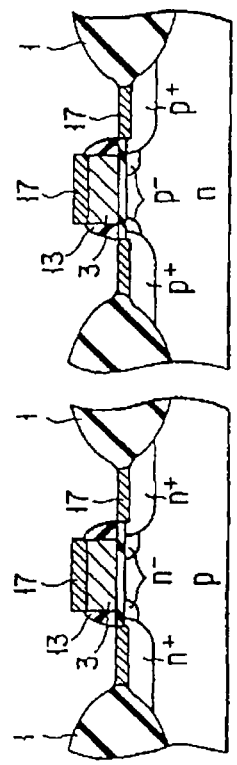 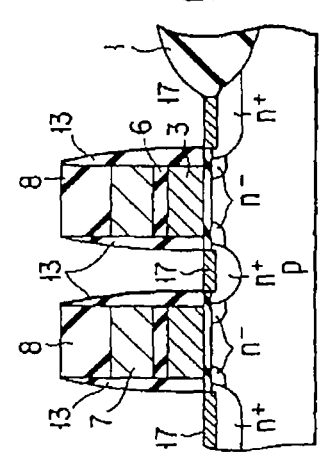
FIG. 15A  FIG. 15B  FIG. 15C

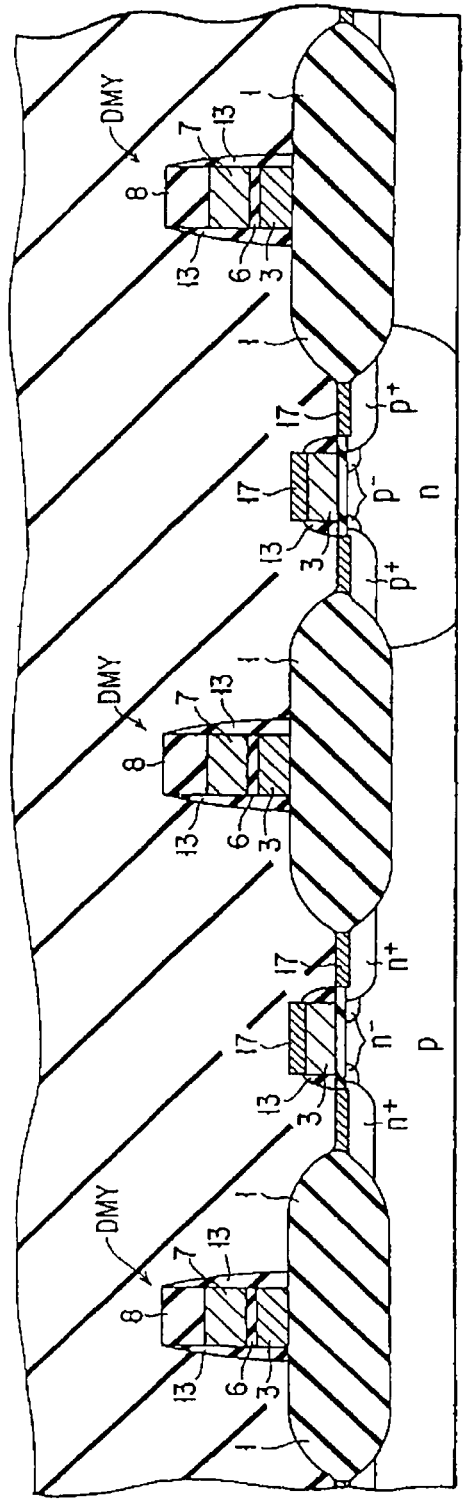
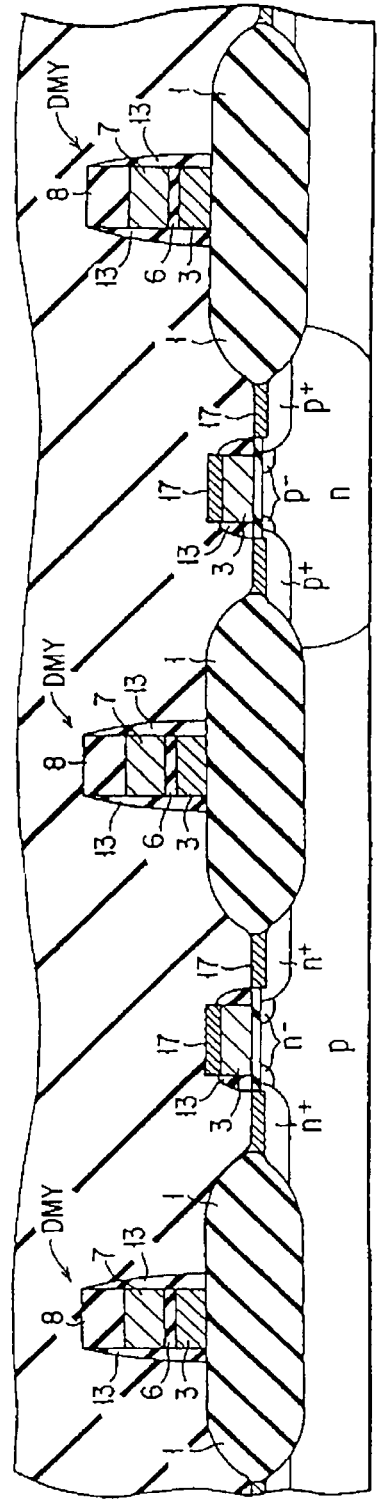
FIG. 16B
FIG. 16C

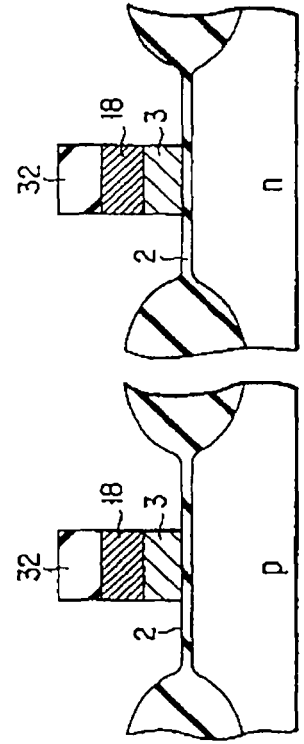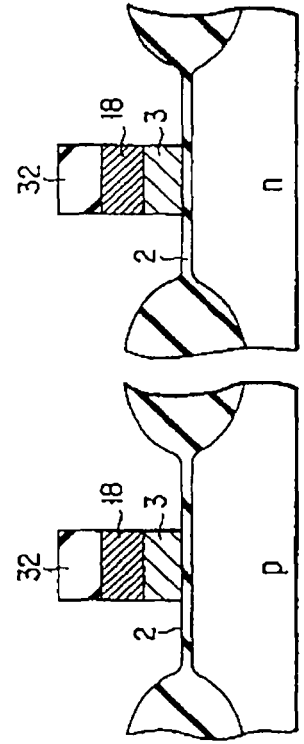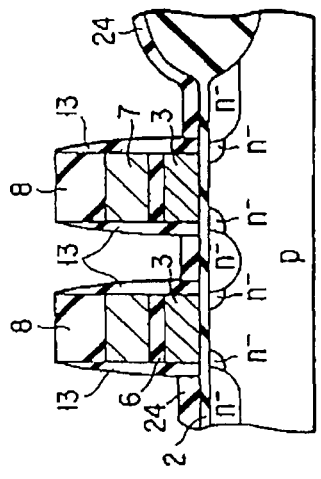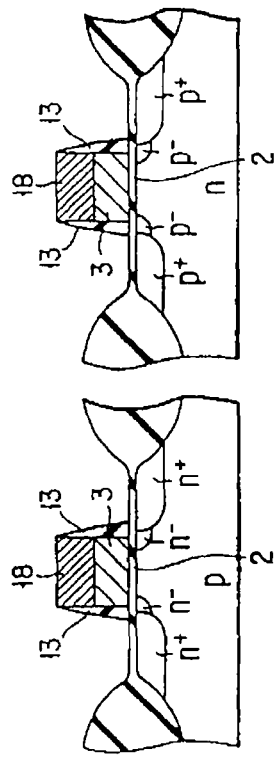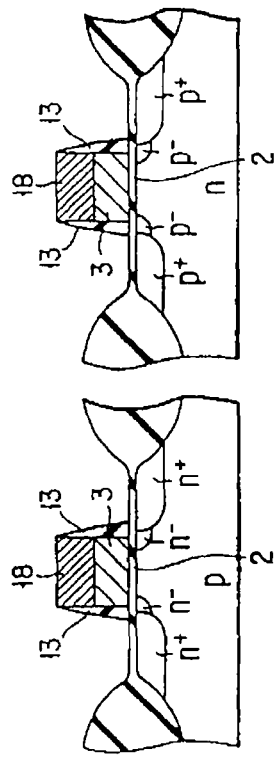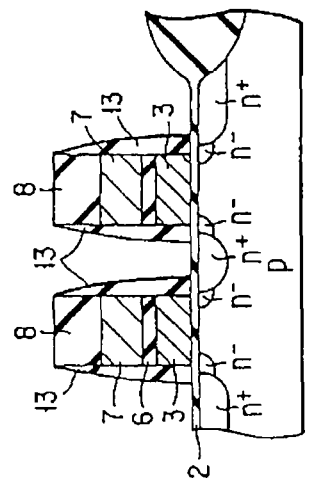

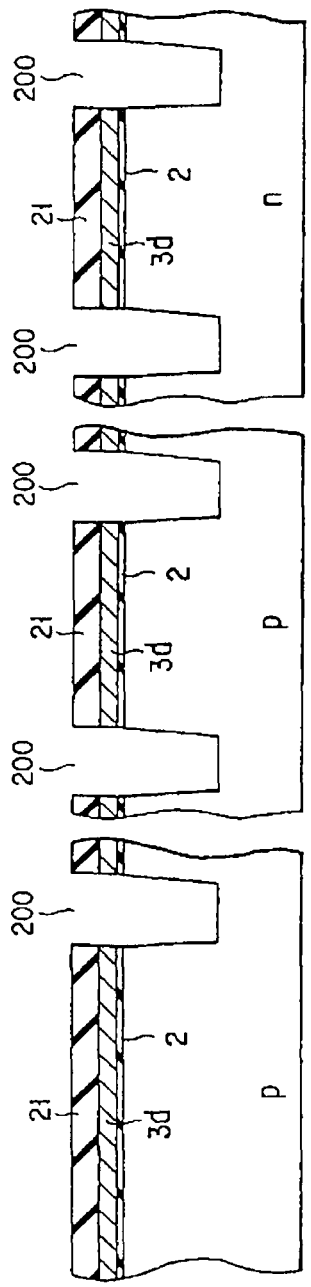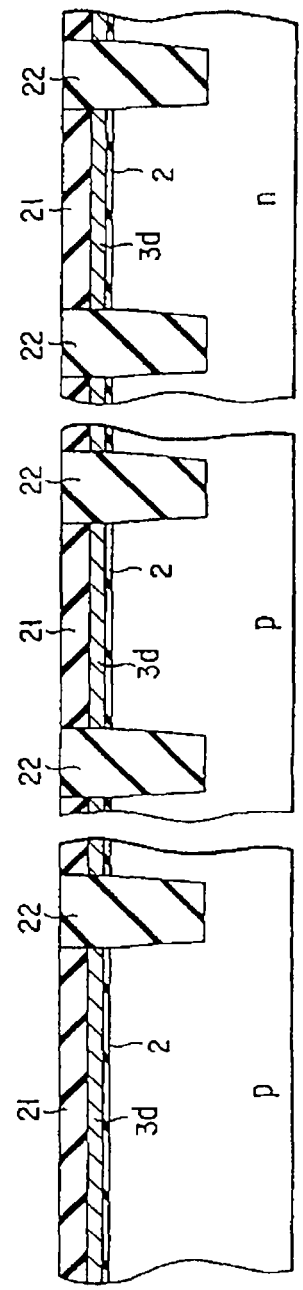

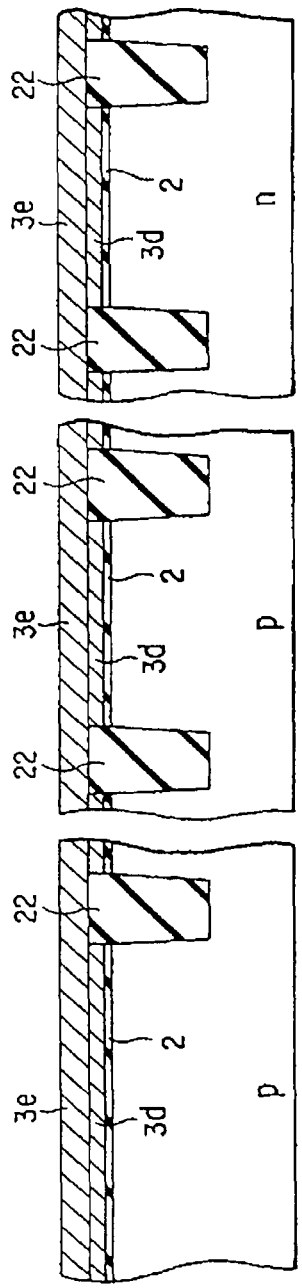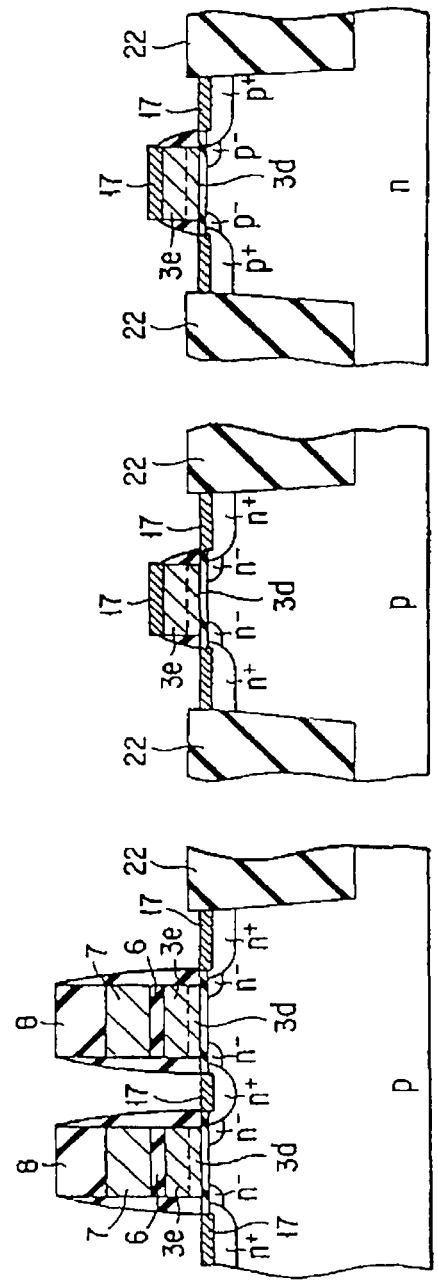

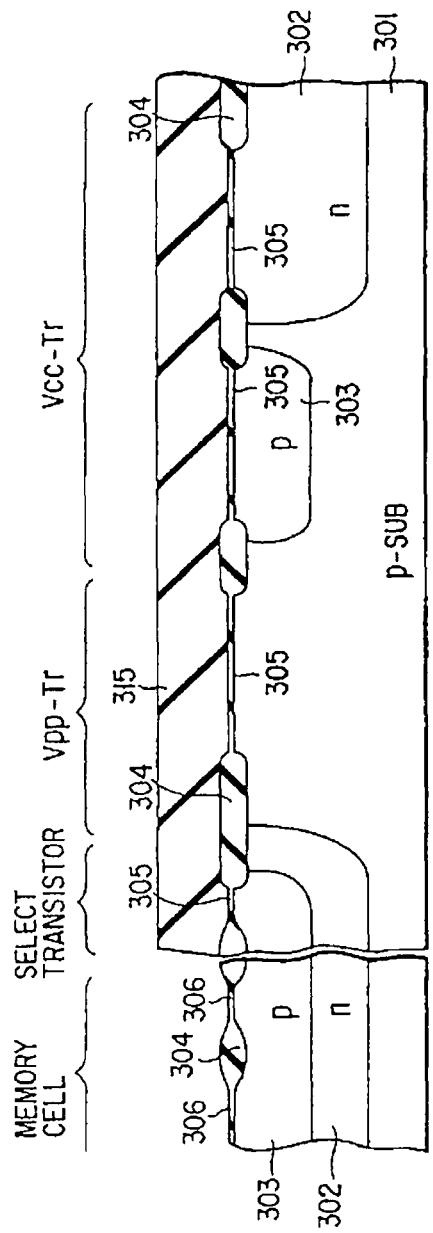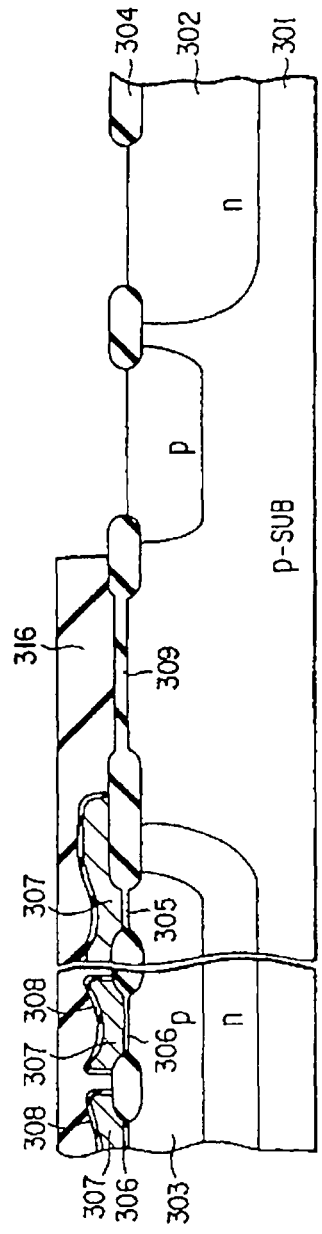
FIG. 36A Prior Art
FIG. 36B Prior Art

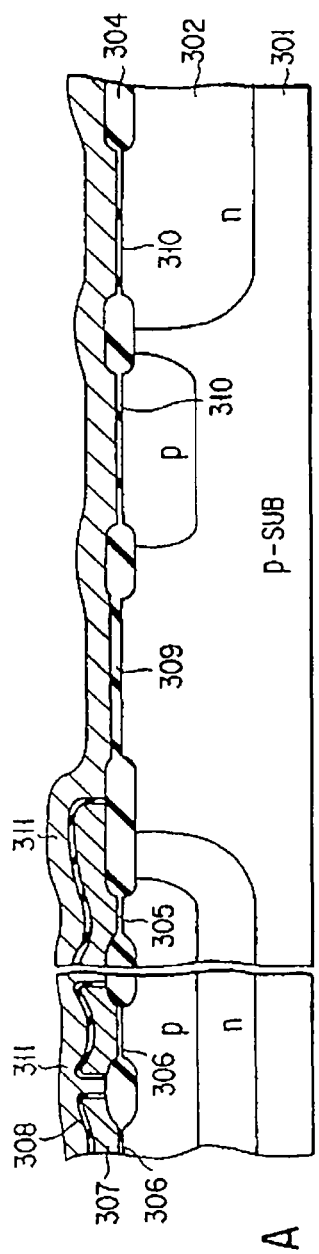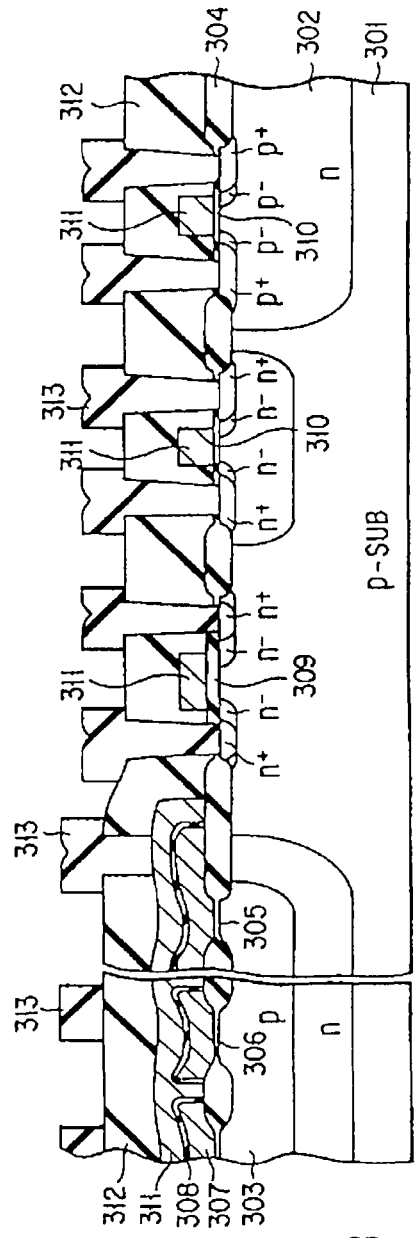
FIG. 37A Prior Art
FIG. 37B Prior Art

NON-VOLATILE SEMICONDUCTOR MEMORY DEVICE AND ITS MANUFACTURING METHOD

CROSS REFERENCE TO RELATED APPLICATIONS

This application is a continuation of and claims the benefit of priority under 35 U.S.C. §120 from U.S. Ser. No. 12/140,946 filed Jun. 17, 2008, which is a continuation of U.S. Ser. No. 11/301,736 filed Dec. 12, 2005, which is a divisional of U.S. Pat. No. 7,005,345 issued Feb. 28, 2006, which is a divisional of U.S. Pat. No. 6,703,658 issued Mar. 9, 2004, which is a continuation of U.S. Pat. No. 6,586,805 issued Jul. 1, 2003, which is a divisional of U.S. Pat. No. 6,472,701 issued Oct. 29, 2002, which is a divisional of U.S. Pat. No. 6,265,739 issued Jul. 24, 2001, and claims the benefit of priority under 35 U.S.C. §119 from Japanese Patent Application No. 9-184863 filed Jul. 10, 1997, the entire contents of each of which are incorporated herein by reference.

BACKGROUND OF THE INVENTION

This invention relates to a non-volatile semiconductor memory device having a double-layer gate structure which includes a gate insulating film, a floating gate layer as a charge storing layer, an insulating film, and a control gate layer. It also relates to a method for manufacturing the device. More particularly, the invention relates to a structure which includes gate insulating films and gate electrodes incorporated in a memory cell section and its peripheral circuit section.

Non-volatile semiconductor memory devices each comprise a memory cell (a memory cell transistor), a select transistor, and a peripheral circuit including a transistor of a high breakdown voltage (Vpp) and a transistor operable with a normal power Vcc (the transistors of the peripheral circuit will hereinafter be referred to as "peripheral circuit transistors"). These transistors have gate insulating films of different thicknesses corresponding to voltages applied thereto.

FIGS. 36A, 36B and FIGS. 37A and 37B are sectional views, illustrating the conventional steps of manufacturing a nonvolatile semiconductor memory device. As is shown in FIG. 36A, N-well regions 302 and P-well regions 303 are formed in a silicon substrate 301, and than sufficiently thick element isolating films 304 are formed by the LOCOS method. Element regions isolated by the element isolating films 304 include, for example, a memory cell section, a select transistor (select Tr), and transistors incorporated in a memory peripheral circuit, such as a high breakdown voltage transistor (Vpp Tr) and a normal power transistor (Vcc Tr). First, a gate oxide film 305 is formed for the select Tr. Then, resist is coated and patterned, thereby covering the region other than a memory cell section with a resist layer 315, removing the gate oxide film 305 and forming a gate oxide film 306 for the memory cell section. In FIGS. 36 and 37, each gap indicates that the memory cell and the select Tr, Vpp Tr and Vcc Tr show different sections.

Referring then to FIG. 36B, a polysilicon layer 307 as a first layer is deposited on the resultant structure and then patterned. Thereafter, an insulating film 308 is formed on each of the patterned polysilicon layers. The polysilicon layers 307 serve as the floating gate of the memory cell and the gate electrode of the select transistor. On the transistor (Vpp Tr, Vcc Tr) side of the peripheral circuit, the insulating film 308, the polysilicon layer 307 as the first layer, and the gate insulating film 305 below the layer 307 are removed. Thereafter, the resist is patterned, thereby forming a gate oxide film 309 in the Vpp Tr section. Further, another resist layer 316 is patterned as shown in FIG. 36C, thereby removing the gate oxide film 309 in the Vcc Tr section.

Subsequently, as shown in FIG. 37C, a gate oxide film 310 is formed in the Vcc Tr section, and then a polysilicon layer (gate electrode) 311 as a second layer is formed. Thereafter, the memory cell section and each transistor section are patterned, ion implantation is performed, an interlayer insulating film 312 is deposited, and wiring layers 313 are formed. Thus, a memory cell, a select transistor, a high breakdown voltage transistor and a Vcc transistor are formed as shown in FIG. 37D.

In the above-described structure, the four gate oxide films 305, 306, 309 and 310 of the transistors are formed in different steps. Therefore, a great number of resist forming steps, oxidation steps, etc. are required, resulting in an increase in manufacturing cost.

Moreover, as described above, in the non-volatile semiconductor memory device having a memory cell section of a double-layer gate structure consisting of a floating gate layer (first polysilicon layer 307) and a control gate layer (second polysilicon layer 311), the gate electrodes of the transistors in the peripheral circuit are usually realized by the use of the control gate layer (second polysilicon layer 311) in the memory cell section. If in this case, surface-channel type N-channel and P-channel MOS transistors are formed as the transistors of the peripheral circuit, the following difficulties will occur:

In general, the control gate layer of a memory cell transistor has a polycide structure formed by depositing, for example, WSi (tungsten silicide) or, the second polysilicon layer to increase the conductivity. Then, the control gate layer is coated with resist and then patterned into a gate electrode.

In the conventional method using the control gate layer as the gates of the transistors of the peripheral circuit, it is necessary before the deposition of WSi to correctly implant each of N-type and P-type impurities into the second polysilicon layer, in order to form N-channel and P-channel MOS transistors of surface-channel type suitable for integration. Then, it is necessary to deposit WSi, and to correctly implant each of N-type and P-type impurities into regions which will serve as source and drain regions, after the gate electrode is formed. Thus, the step of patterning resist and the step of implanting impurities must be repeated.

If, on the other hand, the gate electrodes of the transistors of the peripheral circuit are formed of the first polysilicon layer 307 which will serve as the floating gate layer of the memory cell, a surface-channel type element can be obtained by implanting, into the gate electrode, an impurity of the same conductivity as that of an impurity implanted in the source and drain regions, after the gate electrode is formed. In this case, however, the high speed operation of the transistors of the peripheral circuit cannot be realized, since the first polysilicon layer 307 as the floating gate layer usually has a higher resistance than the second polysilicon layer 311 as the control gate layer.

As explained above, in the conventional method, the transistors of the peripheral circuits have gate insulating films of different thicknesses, which inevitably increases the manufacturing steps and hence the manufacturing cost. To achieve high speed operation, the gate of each transistor of the peripheral circuit of the memory usually has the same polycide structure as the control gate layer of the memory cell section. If a surface-channel type element is realized by the transistor with the gate of the polycide structure, a great number of resist patterning steps and impurity implanting steps are required, thereby increasing the manufacturing cost.

BRIEF SUMMARY OF THE INVENTION

The present invention has been developed in light of the above circumstances, and is aimed at providing a non-volatile semiconductor memory device which can be manufactured by a small number of steps, and a method of manufacturing the device. The invention is also aimed at providing a non-volatile semiconductor memory device which can be manufactured by a small number of steps and operate at a high speed in a highly reliable manner, and a method for manufacturing the device.

According to a first aspect of the invention, there is provided a non-volatile semiconductor memory device comprising: a plurality of memory cell units each including at least one memory cell formed by stacking a charge storing layer and a control gate layer above a semiconductor substrate in which data is programmed and erased by charging and discharging the charge storing layer; a plurality of select transistors each connected to a corresponding one of the memory cell units; and first and second transistors each for controlling a voltage to be applied to at least one of the memory cells and the select transistor connected thereto, the first transistor having a first gate insulating film, and the second transistor having a second gate insulating film with a different thickness from the first gate insulating film, wherein a gate insulating film incorporated in the memory cell, a gate insulating film incorporated in the select transistor and the first gate insulating film are formed of substantially the same film.

In the non-volatile semiconductor memory device according to the first aspect of the present invention, the second gate insulating film may be thicker than the first insulating film.

According to a second aspect of the invention, there is provided a non-volatile semiconductor memory device comprising: a plurality of memory cell units each including at least one memory cell formed by stacking a charge storing layer and a control gate layer above a semiconductor substrate in which data is programmed and erased by charging and discharging the charge storing layer; a plurality of select transistors each connected to a corresponding one of the memory cell units; and first and second transistors each for controlling a voltage to be applied to at least one of the memory cells and the select transistor connected thereto, the first transistor having a first gate insulating film, and the second transistor having a second gate insulating film with a different thickness from the first gate insulating film, wherein a gate insulating film incorporated in the memory cell and the first gate insulating film are formed substantially the same film, and a gate insulating film incorporated in the select transistor and the second gate insulating film may be formed of substantially the same film.

In the non-volatile semiconductor memory device according to the second aspect of the present invention, the second gate insulating film may be thicker than the first insulating film.

According to a third aspect of the invention, there is provided a non-volatile semiconductor memory device comprising: a plurality of memory cell units each including at least one memory cell formed by stacking a charge storing layer and a control gate layer above a semiconductor substrate in which data is programmed and erased by charging and discharging the charge storing layer; a plurality of select transistors each connected to a corresponding one of the memory cell units; and first and second transistors each for controlling a voltage to be applied to at least one of the memory cells and the select transistor connected thereto, the first transistor having a first gate insulating film, and the second transistor having a second gate insulating film with a different thickness from the first gate insulating film, wherein a gate insulating film incorporated in the select transistor and the second gate insulating film are formed of substantially the same film.

In the non-volatile semiconductor memory device according to the third aspect of the present invention, the second gate insulating film may be thicker than the first insulating film.

In the non-volatile semiconductor memory device according to the third aspect of the present invention, the second gate insulating film may be thinner than the first insulating film.

According to a fourth aspect of the invention, there is provided a non-volatile semiconductor memory device comprising: a memory cell having a self-aligned double-layer gate structure which includes a gate insulating film, a first conductor serving as a floating gate layer, a second conductor serving as a control gate layer, and an insulating film electrically insulating the first and second conductors, the gate insulating film, the first conductor, the second conductor and the insulating film being formed above a semiconductor substrate; and a transistor having a gate electrode which is formed above the semiconductor substrate and has a structure wherein a third conductor differing from the second conductor is stacked on the first conductor.

In the non-volatile semiconductor memory device according to the fourth aspect of the present invention, the gate insulating film of the memory cell and a gate insulating film incorporated in the transistor may be formed of substantially the same film.

In the non-volatile semiconductor memory device according to the fourth aspect of the present invention, the third conductor may have a resistance lower than the first conductor.

In the non-volatile semiconductor memory device according to the fourth aspect of the present invention, the first conductor included in the gate electrode may have a conductivity type identical to that of source and drain regions incorporated in the transistor, and the transistor may have a salicide structure.

In the non-volatile semiconductor memory device according to the fourth aspect of the present invention, the third conductor may be a metal.

In the non-volatile semiconductor memory device according to the fourth aspect of the present invention, the first conductor may be one selected from the group consisting of monocrystalline silicon, polysilicon and amorphous silicon.

In the non-volatile semiconductor memory device according to the fourth aspect of the present invention, the non-volatile semiconductor memory device may further comprise a resistive element with the double-layer gate structure, the resistive element including the first conductor used as a resistor, the second conductor and the insulating film having portions thereof removed from a region of the first conductor, and the third conductor provided on the region of the first conductor. The region of the first conductor on which the third conductor may be formed serves as a contact region in the resistive element.

In the non-volatile semiconductor memory device according to the fourth aspect of the present invention, the non-volatile semiconductor memory device may further comprise an element isolating region adjacent to the transistor, and a pattern with the double-layer gate structure provided on the element isolating region.

According to a fifth aspect of the invention, there is provided a method of manufacturing a non-volatile semiconductor memory device, comprising the steps of: forming, on a first region of a semiconductor substrate, a self-aligned double-layer gate structure which includes a gate insulating film, a first conductor serving as a floating gate layer, a second conductor serving as a control gate layer, and an insulating film electrically insulating the first and second conductors, patterning the first conductor into a gate electrode of a transistor above a second region of the semiconductor substrate; and providing a third conductor on the first conductor patterned in the form of the gate electrode above the second region.

In the non-volatile semiconductor memory device according to the fifth aspect of the present invention, the method of manufacturing a non-volatile semiconductor memory device may further comprise the steps of forming an element isolating region adjacent to the transistor, and forming the double-layer gate structure on the element isolating region.

According to a sixth aspect of the invention, there is provided a method of manufacturing a non-volatile semiconductor memory device, comprising the steps of: sequentially forming, on a semiconductor substrate, a gate insulating film, a first conductor serving as a floating gate layer, an insulating film, and a second conductor serving as a control gate layer; patterning the second conductor, the insulating film and the first conductor in a self-aligned manner in a first region of the semiconductor substrate, using a single mask, thereby forming a double-layer gate structure, and removing that portion of the second conductor which is provided on a second region of the semiconductor substrate during the patterning of the second conductor in the first region; forming a third conductor on the first conductor in the second region after the patterning of the first conductor in the first region, such that the first and third conductors are electrically connected to each other; and patterning the third and first conductors into a gate electrode of a transistor in the second region.

In the non-volatile semiconductor memory device according to the sixth aspect of the present invention, the non-volatile semiconductor memory device may further comprise the steps of forming an element isolating region adjacent to the transistor, and forming the double-layer gate structure on the element isolating region.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A-5C are first sectional views, each showing an essential part of a non-volatile semiconductor memory device according to a second embodiment, which are seen in a process step;

FIGS. 8A-8C are fourth sectional views, each showing an essential part of the non-volatile semiconductor memory device according to the second embodiment, which are seen in a process step;

FIGS. 9A-9C are fifth sectional views, each showing an essential part of the non-volatile semiconductor memory device according to the second embodiment, which are seen in a process step;

FIGS. 10A-10C are sixth sectional views, each showing an essential part of the non-volatile semiconductor memory device according to the second embodiment, which are seen in a process step;

FIGS. 11A-11C are seventh sectional views, each showing an essential part of the non-volatile semiconductor memory device according to the second embodiment, which are seen in a process step;

FIGS. 12A-12C are eighth sectional views, each showing an essential part of the non-volatile semiconductor memory device according to the second embodiment, which are seen in a process step;

FIGS. 13A-13C are ninth sectional views, each showing an essential part of the non-volatile semiconductor memory device according to the second embodiment, which are seen in a process step;

FIGS. 14A-14C are tenth sectional views, each showing an essential part of the non-volatile semiconductor memory device according to the second embodiment, which are seen in a process step;

FIGS. 15A-15C are eleventh sectional views, each showing an essential part of the non-volatile semiconductor memory device according to the second embodiment, which are seen in a process step;

FIG. 16B is a sectional view, showing a part of a non-volatile semiconductor memory device, which is seen in a process step;

FIG. 16C is a sectional view, showing a part of the non-volatile semiconductor memory device, which is seen in a process step;

FIGS. 20A-20C are first sectional views, each showing an essential part of a non-volatile semiconductor memory device according to a fifth embodiment, which are seen in a process step;

FIGS. 21A-21C are second sectional views, each showing an essential part of the non-volatile semiconductor memory device according to the fifth embodiment, which are seen in a process step;

FIGS. 25A-25C are first sectional views, each showing an essential part of a non-volatile semiconductor memory device according to a seventh embodiment, which are seen in a process step;

FIGS. 26A-26C are second sectional views, each showing an essential part of the non-volatile semiconductor memory device according to the seventh embodiment, which are seen in a process step;

FIGS. 27A-27C are third sectional views, each showing an essential part of the non-volatile semiconductor memory device according to the seventh embodiment, which are seen in a process step;

FIGS. 28A-28C are fourth sectional views, each showing an essential part of the non-volatile semiconductor memory device according to the seventh embodiment, which are seen in a process step;

FIGS. 36A and 36B are sectional views, useful in explaining conventional process steps of manufacturing a non-volatile semiconductor memory device; and FIGS. 37A and 37B are sectional views, useful in explaining conventional process steps performed after the steps shown in FIGS. 36A and 36B.

DETAILED DESCRIPTION OF THE INVENTION

Figure 1:
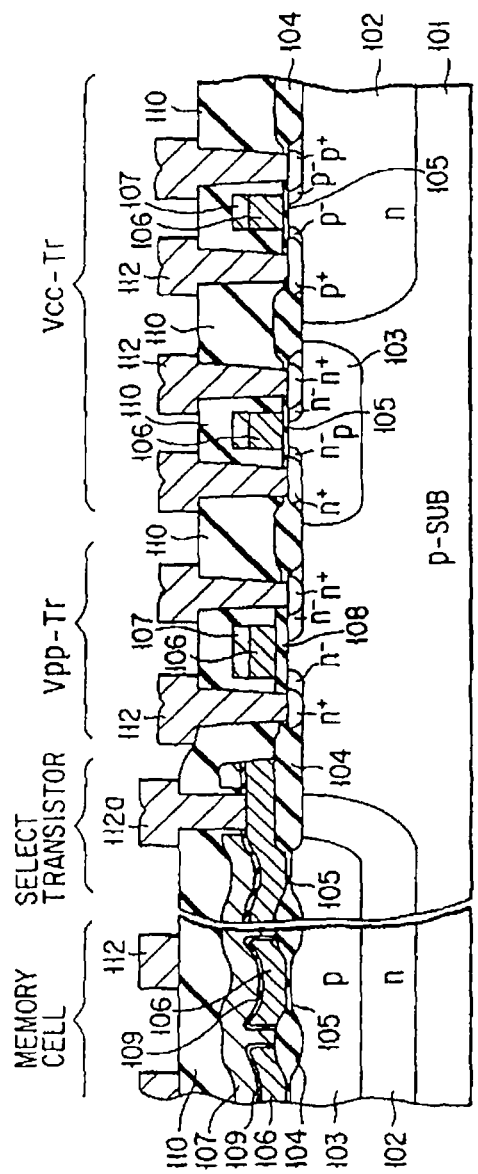
FIG. 1 is a sectional view, showing a non-volatile semiconductor memory device according to a first embodiment of the invention.

FIG. 1 is a sectional view, showing a non-volatile semiconductor memory device according to a first embodiment of the invention. As is shown in FIG. 1, N-wells 102 and P-wells 103 are selectively formed in a P-type silicon substrate 101. In a region in which a memory cell array is formed, a P-well 103 is formed in a surface portion of an N-well 102. Thick element isolating films 104 are selectively formed on the silicon substrate 101 by the LOCOS method. Element regions isolated by the films 104 include, for example, a memory cell region, a select transistor (select Tr) region, a high breakdown voltage transistor (Vpp Tr) region, and a normal power transistor (Vcc Tr) region. Like FIGS. 36A, 36B, 37A and 37B, the gap in FIG. 1 indicates that the memory cell and the select Tr, Vpp Tr and Vcc Tr show different sections.

The memory cell and the select Tr has the same gate insulating film 105 as the Vcc Tr. A first polysilicon layer 106 which will serve as a floating gate layer and a second polysilicon layer 107 which will serve as a control gate layer are stacked on each gate insulating film. An insulating film 109 is interposed between the first and second polysilicon layers 106 and 107. The insulating film 109 consists of, for example, a $SiO_2/Si_3N_4/SiO_2$ laminated film (ONO film). In the select Tr, part of the first polysilicon layer 106 is directly connected to a metallic wire member 112a. In the memory cell, the first polysilicon layer (floating gate layer) 106 is a charge storing layer. Data programming and erasing is performed in the first polysilicon layer when electricity is charged or discharged under the control of the second polysilicon layer (control gate layer). A single memory cell or a plurality of memory cells connected to each other constitute a memory cell unit. FIG. 1 shows a section of a memory cell arrangement in which a single control gate (second polysilicon layer 107) is commonly used. When, for example, this invention is applied to a NAND EEPROM, a predetermined number of memory cells arranged in a direction perpendicular to that section constitute a memory cell unit. Each memory cell unit is connected to at least one select transistor (select Tr). A plurality of memory cell units constructed as above form a memory cell array (not shown).

The high breakdown voltage transistor (Vpp Tr) and the normal power transistor (Vcc Tr) are used to control the voltage for controlling the memory cell and the select Tr.

A gate insulating film 108 incorporated in the Vpp Tr is thicker than the gate insulating film 105 of the Vcc Tr. Gate insulating films incorporated in the memory cell, the select Tr, and the Vcc Tr of a peripheral circuit are constituted of the gate insulating film 105 formed in a single process step, which means that the gate insulating films are formed of substantially the same film.

The gate electrodes of the Vpp Tr and Vcc Tr are realized by the use of the first polysilicon layer 106. The second polysilicon layer (control gate layer) 107 of, for example, high impurity concentration is provided on the first polysilicon layer 106. However, the material provided on the first polysilicon layer 106 included in the gate electrode of the Vpp Tr or Vcc Tr is not limited to the second polysilicon layer (control gate layer) 107, but may be salicide or a metal.

Openings are selectively formed in an interlayer insulating film 110 provided on the entire surface of the substrate, through which a metallic wire member 112 extends and is electrically connected to the gate of the select Tr and the source/drain diffusion layers ($N^+$ diffusion layers, $P^+$ diffusion layers).

With the above structure, the gate insulating films are commonly used, and hence omit the gate oxidation step for forming the peripheral transistors. Accordingly, the non-volatile semiconductor memory device can be manufactured at low cost.

A method for manufacturing the memory device will be described.

Figure 2A:
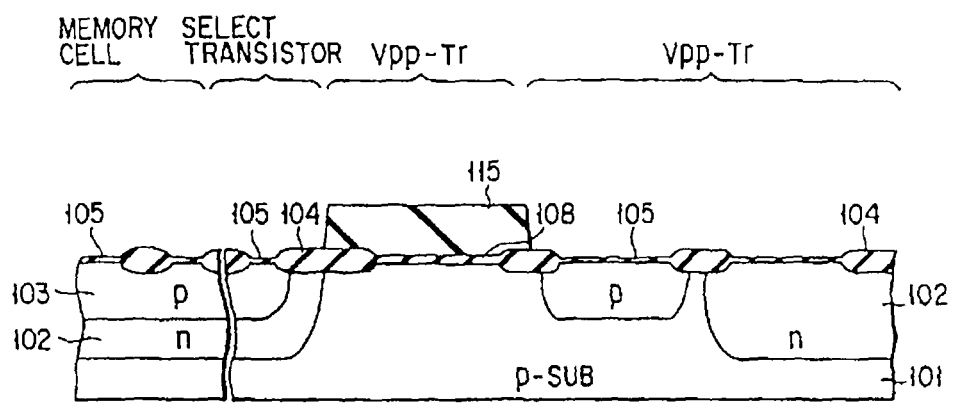
FIGS. 2A-2C are sectional views, illustrating in order steps of a process for manufacturing the structure of FIG. 1.
Figure 2B:
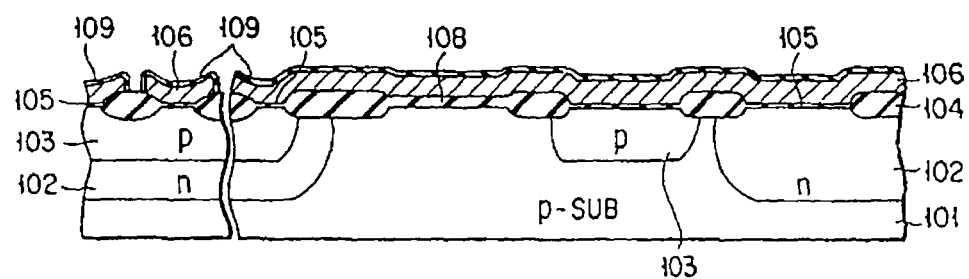
Figure 2C:
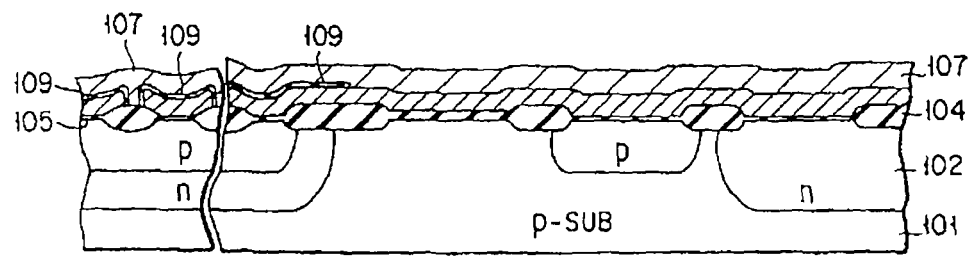

FIGS. 2A-2C are sectional views, illustrating in order steps of a process for manufacturing the structure of FIG. 1. First, as is shown in FIG. 2A, the N-wells 102 and P-wells 103 are selectively formed in the silicon substrate 101. A thick element isolating film 104 of about 300 nm is formed on the silicon substrate 101 by the LOCOS method. Then, a gate insulating film 108 with a thickness of, for example, 40 nm for the Vpp Tr (high breakdown voltage transistor) is formed. Subsequently, the region in which the Vpp Tr will be formed is coated with a resist layer 115, thereby removing the gate insulating film 108 on the other region. Thereafter, a gate insulating film with a thickness of, for example, 8 nm is formed on the region other than the region for the Vpp Tr, i.e. on the region for the memory cell, the select Tr and the Vcc Tr.

After removing the resist layer 115, the first polysilicon layer 106 is deposited on the gate insulating films 105 and 108 as shown in FIG. 2B. After patterning the region for the memory cell, the insulating film 109 as the SiO$_2$/Si$_3$N$_4$/SiO$_2$ laminated film (ONO film) is provided on the first polysilicon layer 106.

Then, as is shown in FIG. 2C, the second polysilicon layer 107 is deposited after the insulating film 109 for the transistors of the peripheral circuit is removed. Thereafter, patterning, ion implantation, deposition of an interlayer insulating film and formation of wires are performed to constitute the FIG. 1 structure.

Since in the above embodiment, gate insulating films of the same kind are intentionally used to minimize the kinds of the entire gate insulating films, the gate oxidation steps for forming the transistors of the peripheral circuit are reduced. Although the embodiment employs two kinds of gate insulating films, i.e. the gate oxide film 108 for the high breakdown voltage transistor and the gate oxide film 105 for the other transistors, the invention is not limited to this. For example, it may be modified such that the same film is used or different films are used to form the gate insulating films of the memory cell and the Vcc Tr, while the same film is used to form the gate insulating films of the select Tr and Vpp Tr.

A modification of the non-volatile semiconductor memory device according to the first embodiment will be described with reference to FIGS. 3 and 4A and 4B.

Figure 3:
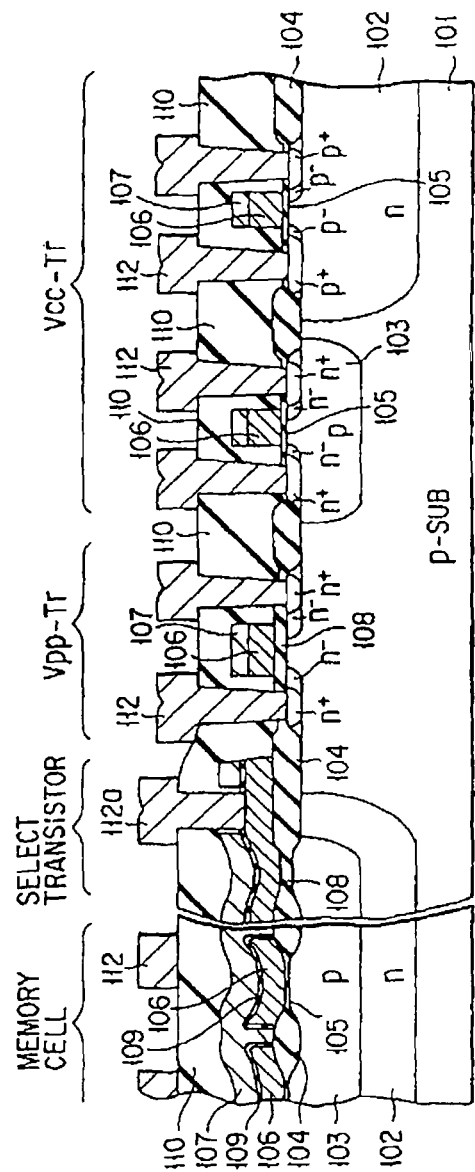
FIG. 3 is a sectional view, showing a first modification of the first embodiment of the invention.

The FIG. 3 structure differs from the FIG. 1 structure in that the gate insulating film of the select Tr is substantially the same as the gate insulating film 108 of the Vpp Tr. For example, the gate insulating films 108 of the select Tr and the Vpp Tr are set at a thickness of 40 nm, and the gate insulating films 105 of the memory cell and the Vcc Tr at a thickness of 8 nm.

The FIG. 4A structure differs from the FIG. 3 structure in that the gate insulating films (i.e. gate insulating films 118) of the Vcc Tr differ from the gate insulating film 105 of the memory cell. Specifically, the select Tr and the Vpp Tr have gate insulating films 108 of 40 nm, the memory cell has a gate insulating film of 8 nm, and the Vcc Tr has gate insulating films 118 of 12 nm.

Figure 4B:
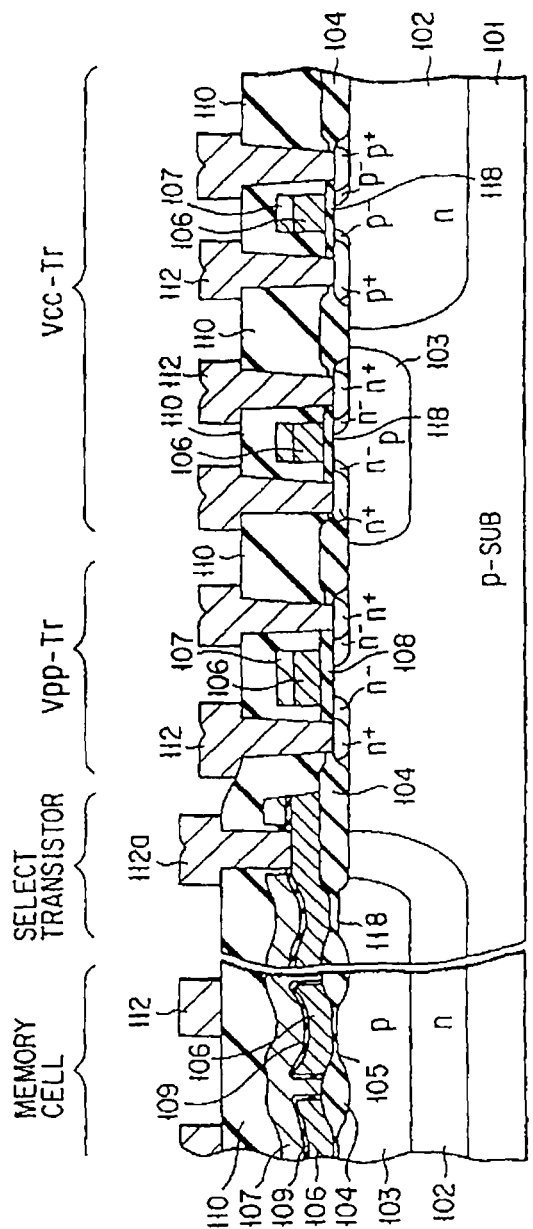
FIG. 4A is a sectional view, showing a second modification of the first embodiment of the invention.
FIG. 4D is a sectional view, showing a third modification of the first embodiment of the invention.

Although in the FIG. 4A structure, the select Tr has substantially the same gate insulating film as the Vpp Tr, it may be modified such that the select Tr has substantially the same gate insulating film as the Vcc Tr, while the memory cell has a gate insulating film differing from that of the Vpp Tr, as shown in FIG. 4B. Specifically, the Vpp Tr has a gate insulating film 108 of 40 nm, the Vcc Tr and the select Tr have gate insulating films 118 of 12 nm, and the memory cell has a gate insulating film of 8 nm.

As in the FIG. 1 case, the gate insulating films are commonly used in the FIGS. 3 and 4A and 4B, and thus the gate oxidation steps for forming the transistors of the peripheral circuit are reduced. To make, in particular, the select Tr have the same gate insulating film as the transistors of the peripheral circuit, as described above, is very advantageous to optimize the gate insulating films of the transistors of the peripheral circuit to enable the transistors to perform high speed operation. This is because the select transistor has less limitations in characteristics than the memory cell transistor, and hence the degree of freedom in the thickness of each gate insulating film of the transistors of the peripheral circuit is not reduced.

Moreover, the invention is advantageous in that the gate electrodes of the peripheral circuit are realized by the use of the first conductive layer (floating gate layer) of the memory cell, and therefore no complicated steps are necessary to make the transistors of the peripheral circuit operable at high speed. In other words, the transistors of the peripheral circuit can be easily made to have a salicide structure or polymetal gates. This will be described in detail below.

FIGS. 5A-5C to 15A-15C are sectional views, illustrating, in order, the steps of manufacturing a non-volatile semiconductor memory device according to a second embodiment of the invention. This non-volatile semiconductor memory device has a double-layer gate structure in which the control gate incorporated therein has a polysilicon/WSi laminated structure. FIGS. 5A-5C to 15A-15C illustrate a structure and a method for making the peripheral transistors of the device operable at high speed. In this case, the gate electrodes of the peripheral transistors are realized by the use of the floating gate layer of the memory cell, thereby causing the transistors to have a salicide structure. Each of FIGS. 5A, 6A, ... 15A is a sectional view of a memory cell section, each of FIGS. 5B, 6B, ... 15B is a sectional view of an N-channel transistor incorporated in the peripheral circuit, and each of FIGS. 5C, 6C, ... 15C is a sectional view of a P-channel transistor incorporated in the peripheral circuit.

First, as is shown in FIGS. 5A-5C, N-type substrate regions with N-wells and P-type substrate regions with P-wells are formed in the semiconductor substrate by, for example, implanting impurities. Element isolating films 1 are formed by, for example, selective oxidation. Then, gate oxide films (insulating films) 2 are formed on activation regions of the substrate by, for example, gate oxidation. Subsequently, a first polysilicon layer 3 which will serve as a floating gate layer is deposited on the resultant structure. If necessary, an N-type impurity is doped into the polysilicon layer 3 by, for example, the phosphor diffusion method. Alternatively, a polysilicon layer 3 beforehand doped with an impurity may be deposited. Further, the resultant structure is subjected to working for forming, for example, cell slits in that portion of the polysilicon layer 3 which corresponds to the memory cell section shown in FIG. 5A (this step is not shown). More specifically, the cell slits are formed in accordance with the plan pattern of the memory cell units of the semiconductor memory device to be formed later.

Figure 6A:
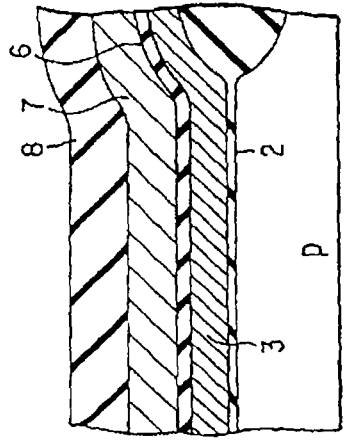
FIGS. 6A-6C are second sectional views, each showing an essential part of the non-volatile semiconductor memory device according to the second embodiment, which are seen in a process step.
Figure 6B:
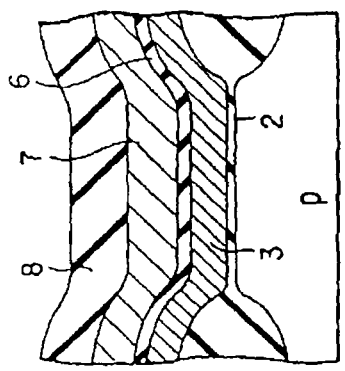
Figure 6C:
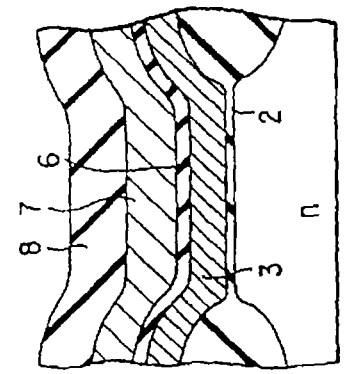

Thereafter, as is shown in FIGS. 6A-6C, an insulating-film (ONO film) 6 consisting of, for example, a SiO$_2$/Si$_3$N$_4$/SiO$_2$ laminated film is deposited. Then, a second polysilicon layer 7 which will serve as a control gate layer is deposited and then doped with an N-type impurity. Alternatively, a polysilicon layer 7 doped with an impurity may be deposited. Subsequently, a WSi layer (not shown), for example, is deposited on the second polysilicon layer 7. Further, an SiN film 8 which will serve as a mask is deposited on the control gate or polysilicon layer 7 in order to increase the conductivity of the control gate layer.

Figure 7A:
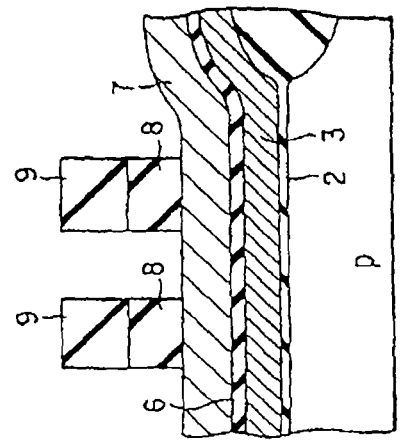
FIGS. 7A-7C are third sectional views, each showing an essential part of the non-volatile semiconductor memory device according to the second embodiment, which are seen in a process step.
Figure 7B:
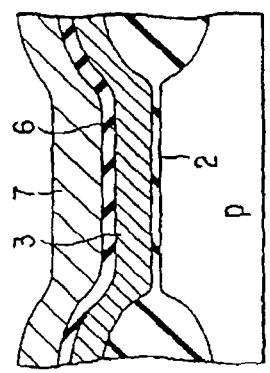
Figure 7C:
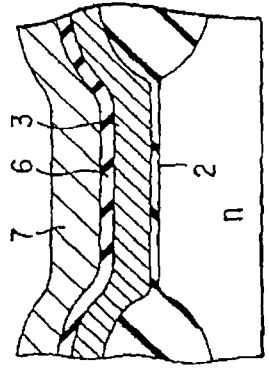

Thereafter, a resist layer 9 is coated and patterned as shown in FIGS. 7A-7C. The SiN film 8 is etched by anisotropic etching (in the memory cell section), and then the resist layer is removed. Referring then to FIGS. 8A-8C, the control gate layer (polysilicon layer) 7 and then the ONO film 6 are etched by anisotropic etching, using the SiN film 8 as a mask. At this time, the memory cell section has a structure as shown in FIG. 8A in which the films 8-6 are treated for the formation of a gate electrode, while the peripheral sections have structures as shown in FIGS. 8B and 8C, in which the floating gate layer is exposed.

Subsequently, as shown in FIGS. 9A-9C, a resist layer 10 is coated and patterned. Then, the floating gate layer (first polysilicon layer 3) is etched by anisotropic etching, using the SiN film 8 and the resist layer 10 as masks in the memory cell section and the peripheral sections, respectively, as shown in respective FIGS. 9A-9C. Then, the resist layer 10 is removed.

Referring then to FIGS. 10A-10C, resist is coated, and patterned into a resist layer 11 such that the N-channel transistors in the memory cell section and the peripheral section are exposed as shown in FIGS. 10A and 10B, thereby doping an N-type impurity which will serve as N− of an LDD (Lightly Doped Drain), and removing the resist layer 11.

Referring to FIGS. 11A-11C, resist is coated, and patterned into a resist layer 12 such that the P-channel transistor in the peripheral section is exposed as shown in FIG. 11C. Then, a P-type impurity which will make a P-region of the LDD is implanted, and the resist layer 12 is removed.

Referring then to FIGS. 12A-12C, an SiN film is deposited, and etched by anisotropic etching such that it remains on the side walls of the transistors in the memory cell and the peripheral circuit as SiN films 13. Then, resist is coated, and patterned into a resist layer 14 such that the P-channel transistor in the peripheral section is exposed as shown in FIG. 12C. Thereafter, a P-type impurity is implanted and the resist layer 14 is removed.

Referring then to FIGS. 13A-13C, resist is coated, and patterned into a resist layer 15 such that the N-channel transistors in the memory cell section and the peripheral sections are exposed. Then, an N-type impurity is implanted and the resist layer 15 is removed.

Then, as shown in FIGS. 14A-14C, the oxide film (insulating films) 2 on the source and drain regions of each transistor are removed, thereby exposing silicon. Subsequently, a Ti/TiN film 16, for example, is deposited by sputtering, and made to react with silicon by annealing at high temperature. Thereafter, non-reacted portions of the Ti/TiN film are removed, and high-temperature annealing is performed again, thereby forming a silicide film 17 and realizing a salicide structure, as shown in FIGS. 15A-15C.

Thus, the source, drain and gate of each transistor in the memory cell section and the peripheral sections are completed as shown in FIGS. 15A-15C. The silicide film 17, which has come to the salicide structure, has a lower sheet resistance and hence a lower resistivity than the polysilicon layer 3 located below. This enables construction of a high-speed CMOS circuit.

Thereafter, various steps (which are not shown) of depositing an interlayer insulating film, forming contact holes and wiring layers, depositing a protect film, etc. are performed. As a result, the non-volatile semiconductor memory device is completed.

Figure 16A:
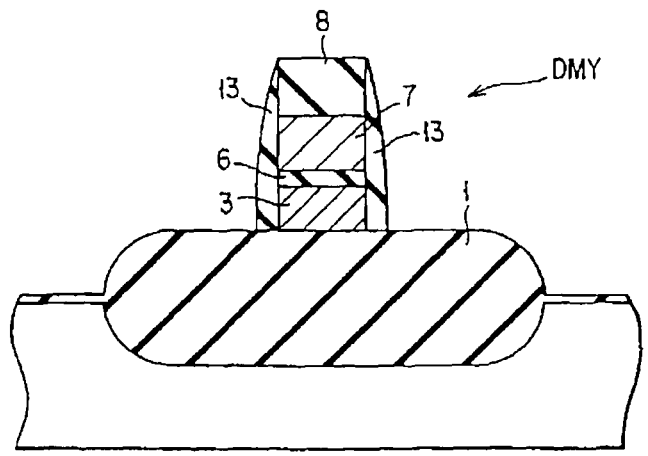
FIG. 16A is a sectional view, showing a part of a non-volatile semiconductor memory device, which is seen in a process step.

If the element structure must be flattened for integration, a dummy pattern DMY of the same double-layer gate structure as the memory cell is formed on the element isolating region near the peripheral transistors, as is shown in FIG. 16A.

As is shown in FIG. 16B, an interlayer insulating film, for example, is formed on an element structure. This interlayer insulating film is polished and flattened by, for example, CMP. If at this time, the distance between each pair of adjacent dummy patterns DMY, i.e. the pitch at which dummy patterns DMY are arranged, is too great, those portions of the interlayer insulating film which are situated between each pair of adjacent dummy patterns are liable to be polished excessively as shown in FIG. 16C. In light of this, it is preferable that the pitch of the dummy patterns DMY is determined on the basis of the to-be-polished material (in this case, the material of the interlayer insulating film) and polishing conditions (the kind of polishing slurry, the rotation speed of a polishing pad, etc.), so as to avoid the aforementioned excessive polishing. In other words, it is desirable that the dummy patterns DMY be arranged at appropriate intervals so that the to-be-polished material between each pair of adjacent dummy patterns DMY will not excessively be polished.

Since in the second embodiment, a single oxide film is used between the transistors of the memory cell section and the peripheral sections, the number of steps of resist forming, oxidation, etc. can be reduced. If the second embodiment includes a select transistor in the memory cell section and a high breakdown voltage transistor in the peripheral circuit (which are not shown), a single gate insulating film thicker than the gate oxide film (insulating film) 2 may be used to realize the transistors. Alternatively, it may be modified, as in the first embodiment, such that only the high breakdown voltage transistor has a gate insulating film which differs from the gate oxide film 2, and the select transistor of the memory cell has the gate oxide film 2. Any combination of gate insulating films may be employed if it can reduce the manufacturing steps such as the oxidation step, as compared with the conventional case.

Moreover, since the second embodiment uses the first polysilicon layer (floating gate layer) to form the gate electrodes of the transistors of the peripheral circuit, thereby employing the salicide structure, surface-channel type MOS transistors can be formed irrespective of whether or not WSi is deposited on the control gate layer. In other words, in FIGS. 10B and 10C-FIGS. 13B and 13C, the same impurity as in the source and drain regions of both P-channel MOS transistors is implanted into the gate thereof, thereby converting the transistors into surface-channel type ones, and then causing them to have a salicide structure as shown in FIGS. 15A-15C. Accordingly, a highly performable non-volatile semiconductor memory device whose peripheral transistors are operable at a high speed can be achieved by a manufacturing method which prevents the process of implanting-impurities from being complicated. The metal to be sputtered onto silicon to obtain the salicide structure is not limited to Ti/TiN.

Figure 17:
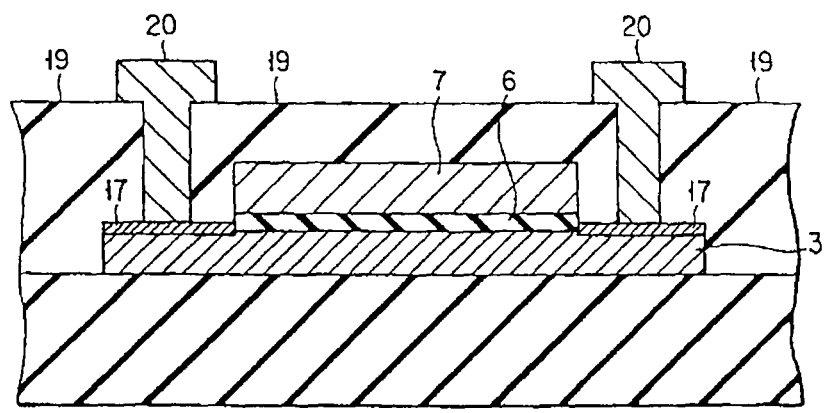
FIG. 17 is a sectional view, showing an essential part according to a third embodiment of the invention.

FIG. 17 is a sectional view, showing a third embodiment of the invention. In this embodiment, the floating gate layer (the first polysilicon layer 3) is used to form a resistive element of high resistance. In the non-volatile semiconductor memory device of the double-layer gate structure according to the third embodiment, the floating gate layer of the memory cell is used to realize the gate electrodes of the transistors in the peripheral circuit, and also realize resistive elements of high resistance in the peripheral element portion.

Specifically, as in the second embodiment, the floating gate layer is formed as in the second embodiment (FIGS. 5A-5C). Then, if necessary, an impurity is implanted into the region of the peripheral section of the memory cell, wherein a resistive element is formed. In other words, resist is coated, and patterned such that the region of the peripheral section wherein a resistive element is formed is exposed. Then, a desired impurity is implanted into the region and the resist is removed.

Subsequently, as in the second embodiment, a structure as shown in FIGS. 6A-6C is formed, in which the SiN film 8 on the control gate layer 7 is the uppermost layer. Thereafter, resist is coated on the memory cell section and the resistive element and then patterned, thereby etching the SiN film 8 by anisotropic etching (these steps are not shown). Concerning the resistive element, the resist is patterned such that it remains on a portion of the resistive element other than a portion to be used as a contact.

Then, as in the second embodiment, the SiN film 8 is used as a mask to etch the control gate layer and the ONO film by anisotropic etching, and the resist is removed. In the following steps which are not shown, resist is coated and patterned, and then the floating gate layer is etched by anisotropic etching, using, as masks, those portions of the resist provided on the gate electrodes of the peripheral transistors and on the contact portion of the resistive element, and those portions of SiN provided in the memory cell section and on the other portion of the resistive element. Then, the resist is removed.

Moreover, as in the second embodiment, the source and drain regions of each transistor are formed, and then salicide is formed.

From the above-described steps, the source, drain and gate of each transistor as shown in FIGS. 15A-15C and a resistive element as shown in FIG. 17 are completed. Thereafter, an interlayer insulating film 19 is deposited, and various steps of forming contact holes and wiring layers, depositing a protect film, etc. are performed. As a result, the non-volatile semiconductor memory device is completed.

FIG. 17 also shows an interlayer insulating film 19 and a metallic wire 20 formed in the step. The remaining second polysilicon layer 7 provides a level which is substantially the same as the peripheral element structure, which contributes to the flattening of the interlayer insulating film 19.

If the element structure must be flattened for integration, a dummy pattern DMY (as shown in FIG. 16A) of the same double-layer gate structure as the memory cell is formed on the element isolating region near the peripheral transistors.

The metal to be sputtered onto silicon to obtain the salicide structure is not limited to Ti/TiN.

The formation of the gate electrodes of the transistors and the resistive element, which are incorporated in the peripheral circuit, may be performed after the formation of the memory cell, instead of simultaneous formation of them.

Referring then to FIGS. 18A-18C and 19A-19C and part of the second embodiment, a method, according to a fourth embodiment, for forming first the memory cell and then the gate electrodes of the transistors and the resistive element, which are incorporated in the peripheral circuit, will be described.

First, in the memory section, etching is performed down to the ONO film 6 or to the second polysilicon layer 7 as shown in FIG. 8A, as in the case of the second embodiment. At this time, in the resistive element, etching is performed down to the ONO film 6 or to the second polysilicon layer 7 as in the case of the third embodiment (these steps are not shown).

Figure 18A:
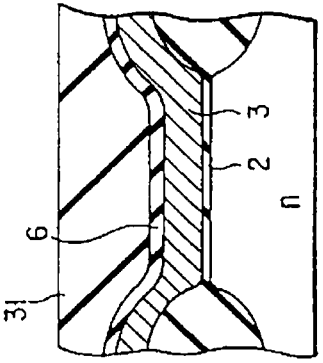
FIGS. 18A-18C are first sectional views, each showing an essential part of a non-volatile semiconductor memory device according to a fourth embodiment, which are seen in a process step.
Figure 18B:
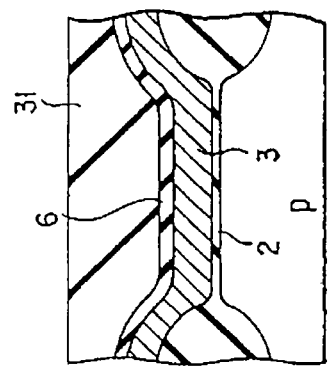
Figure 18C:
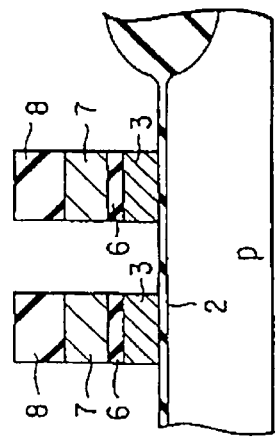

After the gates are formed, a resist layer 31 is formed in the transistor sections of the peripheral circuit as shown in FIGS. 18B and 18C. Then, the floating gate layer (the first polysilicon layer 3) in the memory cell section is etched by anisotropic etching, thereby removing the resist layer 31.

Figure 19A:
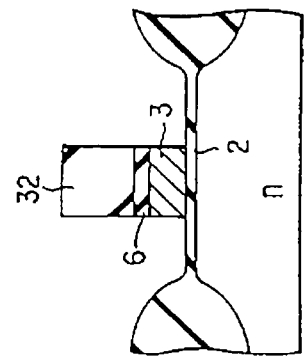
FIGS. 19A-19C are second sectional views, each showing an essential part of the non-volatile semiconductor memory device according to the fourth embodiment, which are seen in a process step.
Figure 19B:
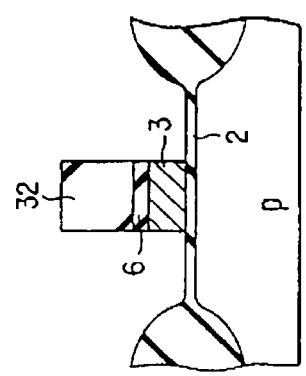
Figure 19C:
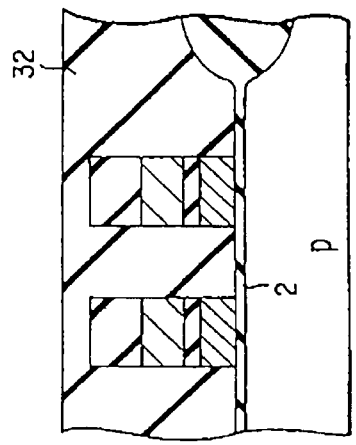

Thereafter, as is shown in FIGS. 19A-19C, resist layer 32 is coated and patterned, thereby etching the floating gate layer in the peripheral sections by anisotropic etching (FIGS. 19B and 19C). At this time, in the resistive element, the floating gate layer is etched by anisotropic etching, using the resist layer 32 as a mask in the contact region, and also using the SiN film as a mask in the remaining region (these steps are not shown). Thereafter, the resist layer 32 is removed. Furthermore, as in the second embodiment, the source and drain regions of each transistor are formed, and then salicide is formed. FIGS. 18 and 19 show an example in which when a gate is formed in the memory section, etching is performed down to the second polysilicon layer 7 in the peripheral sections. In this example, the ONO film 6 remaining on each gate is removed when the oxide film (insulating film) 2 on the source and drain regions are removed before the formation of the salicide structure.

After the above-described steps, the source, drain and gate of each transistor and the resistive element are completed as shown in FIGS. 15A-15C and 17, respectively. Then, various steps of depositing an interlayer insulating film, forming contact holes and wiring layers, depositing a protect film, etc. are performed. As a result, the non-volatile semiconductor memory device is completed. FIG. 17 also shows an interlayer insulating film and wiring, which are formed in steps performed later.

If the element structure must be flattened for integration, a dummy pattern DMY of the same double-layer gate structure as the memory cell is formed on the element isolating region near the peripheral transistors, as is shown in FIG. 16A.

The metal to be sputtered onto silicon to form the salicide structure is not limited to Ti/TiN.

Referring to FIGS. 20A-20C and 21A-21C and part of the fourth embodiment, a fifth embodiment will be described. This embodiment is similar to the fourth embodiment in that the floating gate layer of the memory cell is used to realize the gate electrodes of the peripheral transistors, but differs from it in that the gate electrodes are formed of polymetal gates each of which consists of, for example, polysilicon and W and enables high-speed operation of the peripheral transistors.

A method will be described, which is used in the fifth embodiment for forming the gate electrodes of the peripheral transistors and the resistive element after the formation of the memory cell section.

As in the fourth embodiment, a structure as shown in FIGS. 18A-18C is formed. Then, an N-type impurity is implanted into the memory cell section shown in FIG. 18A to form source and drain regions therein, and thereafter the resist layer 31 is removed.

If it is necessary to form an LDD structure, an N-type impurity of a certain concentration, which will serve as N⁻ of the LDD structure, is implanted during the step of implanting the N-type impurity. In the following steps which are not shown, an SiN film is deposited, resist is coated and patterned such that the memory cell section is exposed, the SiN film is etched by anisotropic etching such that it remains on the gate side walls of the memory cell, an N-type impurity of an impurity concentration higher than the N⁻ is implanted, and the resist layer 31 is removed.

In the following steps which are not shown, SiN is deposited, resist is coated and patterned, SiN and the ONO film 6 in the peripheral sections are removed by etching, the resist is removed, and the memory cell section is protected by an SiN film 24 (shown in FIG. 20A).

Thereafter, a W film 18, for example, is deposited, and resist is coated and patterned into resist layers 32, as is shown in FIGS. 20A-20C. Subsequently, the W film 18 and the floating gate layer (the first polysilicon layer) 3 in the peripheral sections are sequentially etched by anisotropic etching, using the resist layers 32 as masks. Then, the resist layers 32 are removed.

Then, as in the second embodiment, source and drain regions are formed in the peripheral sections, with the result that the source, drain and gate of the transistors are completed, as shown in FIGS. as is shown in FIGS. 21A-21C.

Figure 22:
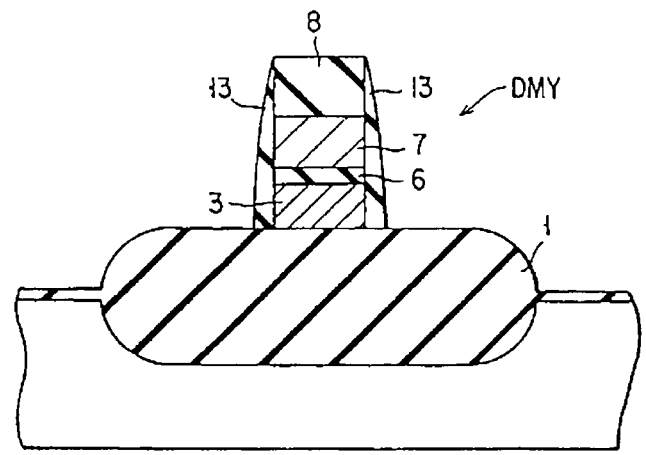
FIG. 22 is a third sectional view, showing an essential part of the non-volatile semiconductor memory device according to the fifth embodiment, which is seen in a process step.

If the element structure must be flattened for integration, a dummy pattern DMY (as shown in FIG. 22) of the same double-layer gate structure as the memory cell is formed on the element isolating region near the peripheral transistors.

Thereafter, various steps of depositing an interlayer insulating film, forming contact holes and wiring layers, depositing a protect film, etc. are performed. As a result, the non-volatile semiconductor memory device is completed. The metal for forming polymetal gates is not limited to W. It suffices if the metal has a sheet resistance and resistivity lower than the first polysilicon layer 3. Since as described above, the gate electrodes of the peripheral transistors are not formed simultaneously with the gate electrode of the memory cell section in the fourth and fifth embodiments, the number of steps required for forming the gate electrodes of the transistors is slightly greater than in the first through third embodiments. However, in the fourth and fifth embodiments, the steps required for gate oxidation for forming the peripheral transistors, and accordingly the manufacturing steps, can be reduced to some extent, since the first conductive layer (the floating gate layer) of the memory cell is also used to form the gate electrodes of the peripheral circuit, which means that gate insulating films of the same kind are intentionally used between the memory cell transistor, or the select transistor, and the peripheral transistors.

Although the first through fifth embodiments employ selective oxidation such as the LOCOS method, as a method for isolating element, the invention is not limited to it. The STI (Shallow Trench Isolation) technique, for example, may be used instead. This method will be described below.

Figure 23:
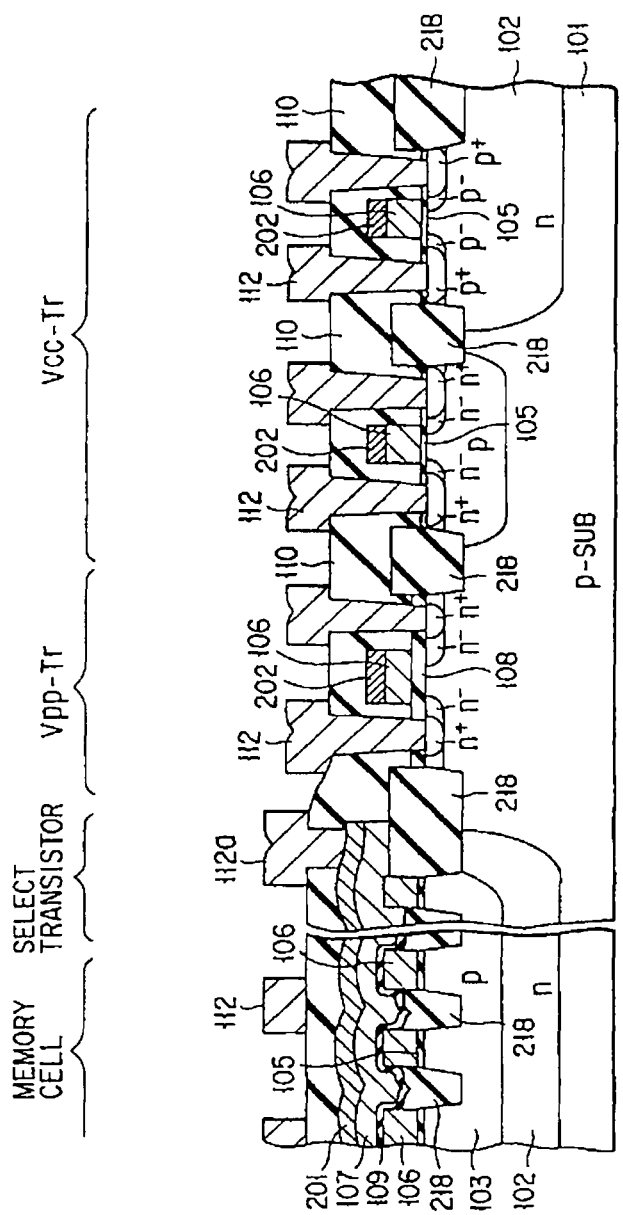
FIG. 23 is a sectional view, showing a non-volatile semiconductor memory device according to a sixth embodiment of the invention.

FIG. 23 shows a non-volatile semiconductor memory device according to a sixth embodiment of the invention. This embodiment differs from the FIG. 1 embodiment in that the former uses element isolating films formed by the STI technique, and also in that in the former, a WSi film 201 is deposited on the second polysilicon layer 107T as the control gate layer of the memory cell section, and the gate electrodes of the peripheral transistors (Vpp Tr, Vcc Tr) each have a polymetal structure constituted of the first polysilicon layer 106 and a W (tungsten) layer 202 provided thereon.

In the sixth embodiment, gate insulating films of two kinds are employed, which include the gate insulating films 105 used in the memory cell transistor, the select Tr and the Vcc Tr, and the gate insulating film 108 used in the high breakdown voltage transistor (Vpp Tr), as in the first embodiment.

Since in the above structure, the kinds of gate insulating films are intentionally reduced, as in the first embodiment, the gate oxidation steps for forming the peripheral transistors can be reduced, with the result that the non-volatile semiconductor memory device can be manufactured at low cost. A method for manufacturing this device will be described.

Figure 24A:
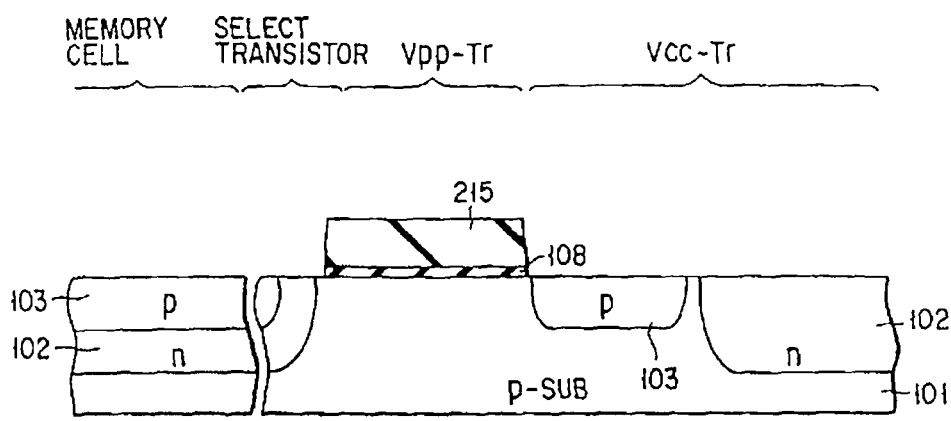
FIGS. 24A-24C are sectional views, useful in explaining a method for manufacturing the structure of FIG. 23.
Figure 24B:
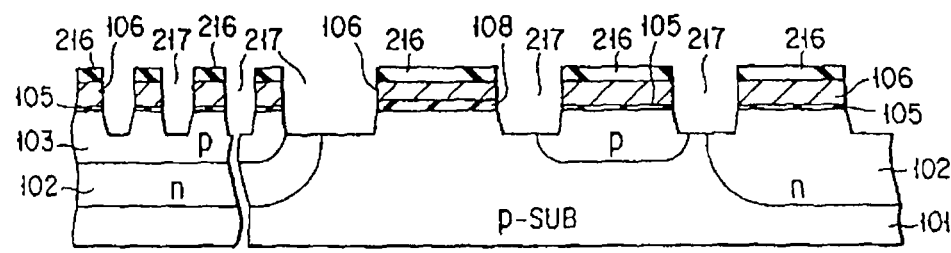
Figure 24C:
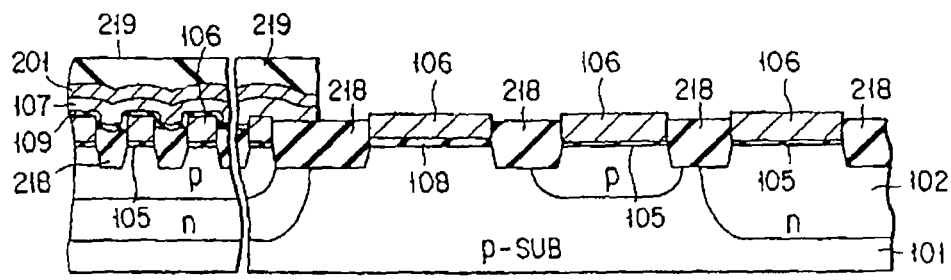

FIGS. 24A-24C are sectional views, illustrating, in order, the steps of manufacturing the FIG. 23 structure.

First, as is shown in FIG. 24A, N-wells 102 and P-wells 103 are selectively formed in a silicon substrate 101. Subsequently, a gate insulating film 108 with a thickness of, for example, 40 nm is formed for a Vpp Tr (high breakdown voltage transistor) in the substrate 101. Then, a resist layer 215 is coated on a region in which the Vpp Tr will be formed, thereby removing that portion of the gate insulating film 108 which is not coated with the resist layer.

Thereafter, as is shown in FIG. 24B, a gate insulating film 105 with a thickness of, for example, 8 nm is formed on the region other than the region for the Vpp Tr, i.e. the region for the memory cell, the select Tr, and the Vcc Tr. After the resist layer 215 is removed, a first polysilicon layer 106 is deposited on the gate insulating films 105 and 108. Then, a resist layer 216 is deposited on the first polysilicon layer 106 and patterned in accordance with to-be-isolated elements. Using the patterned resist layer 216 as a mask, trenches 217 are formed by the STI method such that they reach the substrate.

Then, as is shown in FIG. 24C, the trenches 217 are filled with insulating films 218 formed of, for example, TEOS (tetraethoxysilane). Subsequently, an insulating film 109 consisting of a $SiO_2/Si_3N_4/SiO_2$ laminated film (ONO film) is formed on the insulating film 218 and the first polysilicon layer 106. Those portions of the insulating film 109 which are provided on the select Tr, the Vpp Tr and the Vcc Tr of the peripheral circuit are removed, and then a laminated layer of a second polysilicon layer 107 and a WSi layer 201 is deposited. Thereafter, in the following steps which are not shown, resist is coated and patterned, thereby removing those portions of the second polysilicon layer 107 and the WSi layer 201 which are provided on the transistor sections of the peripheral circuit.

Further, in the following steps which are not shown, the gates of the memory cell and the select Tr are formed, and ions are implanted into the source and drain regions of the memory cell and the select Tr. Subsequently, the memory cell and the select Tr are masked, and a W layer 202 is deposited on those portions of the first polysilicon layer 106 which are coated on the Vpp Tr and the Vcc Tr of the peripheral circuit. Then, resist is coated and patterned, thereby etching first the W layer 202 and then the first polysilicon layer 106 by anisotropic etching. Thereafter, the steps of forming the source and drain regions of the Vpp Tr and Vcc Tr of the peripheral circuit, forming the entire wiring, etc. are performed. As a result, the FIG. 23 structure is obtained.

Also in this embodiment, the kinds of gate insulating films are intentionally reduced, thereby reducing the gate oxidation steps for forming the transistors of the peripheral circuit. This embodiment may be modified, for example, such that the memory cell transistor has the same gate insulating film as the Vcc Tr, while the select Tr has the same gate insulating film as the Vpp Tr.

Moreover, since the gate electrodes of the peripheral circuit are realized by the use of the first conductive layer (the floating gate layer) of the memory cell, no complicated step is necessary to make the transistors of the peripheral circuit operable at high speed. A description will be given of a case where the transistors of the peripheral circuit have a salicide structure.

FIGS. 25A-25C to 28A-28C are sectional views, illustrating, in order, the steps of manufacturing a non-volatile semiconductor memory device according to a seventh embodiment. This embodiment uses element-isolating films formed by the STI (Shallow Trench Isolation) technique. The memory device of this embodiment has a double-layer gate structure in which the control gate has a laminated structure of, for example, polysilicon and WSi, and the gate electrodes of the peripheral transistors are formed using the floating gate of the memory cell, thereby making the transistors have a salicide structure which enables high speed operation of them. Each of FIGS. 25A, 26A, 27A and 28A is a sectional view of a memory cell section, each of FIGS. 25B, 26B, 27B and 28B is a sectional view of an N-channel transistor incorporated in the peripheral circuit, and each of FIGS. 25C, 26C, 27C and 28C is a sectional view of a P-channel transistor incorporated in the peripheral circuit.

First, as is shown in FIG. 25A-25C, N-type substrate regions with N-wells and P-type substrate regions with P-wells are formed in the semiconductor substrate by implanting impurities. Then, gate oxide films (insulating films) 2 are formed on the substrate by, for example, gate oxidation. Subsequently, a first polysilicon layer 3d which will serve as a floating gate layer is deposited on the resultant structure. If necessary, an N-type impurity is doped into the polysilicon layer 3d by, for example, the phosphor diffusion method. Alternatively, a polysilicon layer 3 beforehand doped with an impurity may be deposited. Subsequently, an SiN film 21 which will serve as a mask is deposited. In the following steps which are not shown, resist is coated and patterned, thereby removing, by anisotropic etching, those portions of the SiN film 21 which are coated on element-isolating regions, and then removing the resist. The polysilicon layer 3d, the gate insulating film 2 and the semiconductor substrate are sequentially etched by anisotropic etching, using the remaining SiN film 21 as a mask, thereby forming trenches 200 in the substrate.

Thereafter, as is shown in FIGS. 26A-26C, an insulating film 22 which consists of, for example, TEOS is deposited. The resultant structure is flattened by, for example, CMP (Chemical Mechanical Polishing) such that the portion of the insulating film 22 which is provided on each portion of the SiN film 21 is removed. Thus, the trenches 200 are each filled with the insulating film 22.

Then, as is shown in FIGS. 27A-27C, the SiN film 21 is removed by wet etching, and another first polysilicon layer 3e which will serve as the floating gate layer is deposited. Subsequently, an N-type impurity, if necessary, is implanted into the polysilicon layer by, for example, the phosphor diffusion method. In the following steps which are not shown, resist is coated and patterned such that cell slits are formed in the memory cell section, the first polysilicon layer is removed by anisotropic etching, and the resist is removed.

The FIGS. 27A-27C structure is similar to the FIGS. 5A-5C structure except that in the former, the element-isolating regions are defined by the trenches, and that the polysilicon layer on the activating region has a laminated structure of the polysilicon films 3d and 3e.

Thereafter, the transistors are formed by the same steps as employed in the second embodiment. Specifically, the peripheral transistors have a salicide structure in which the gate electrodes are realized by the use of the floating gate layer of the memory cell (the first polysilicon films 3d, 3e) as shown in FIG. 28A-28C.

If this embodiment includes a select Tr for the memory cell and a high breakdown voltage transistor in the peripheral circuit (which transistors are not shown), these transistors may be formed by the use of a single gate insulating film which is thicker than the gate oxide film (insulating film) 2. Alternatively, it may be modified such that only the high breakdown voltage transistor has a gate insulating film which differs from the gate insulating film 2, and the select Tr for the memory cell is realized using the gate insulating film 2. In other words, any combination of gate insulating films may be employed if it can reduce the manufacturing steps such as oxidation.

Figure 29:
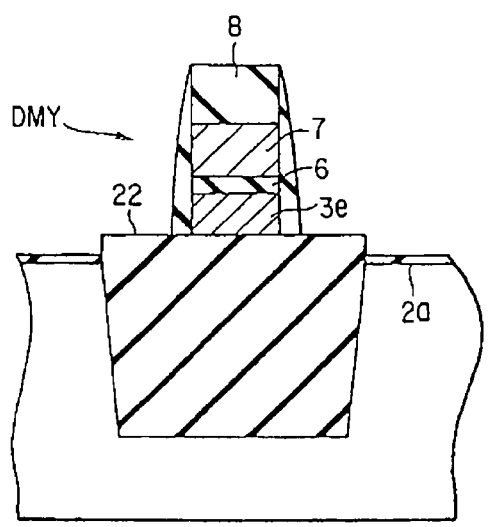
FIG. 29 is a fifth sectional view, showing an essential part of the non-volatile semiconductor memory device according to the seventh embodiment, which is seen in a process step.

If the element structure must be flattened for integration, a dummy pattern DMY (as shown in FIG. 29) of the same double-layer gate structure as the memory cell is formed on the element isolating region near the peripheral transistors. Thereafter, various steps (which are not shown) of depositing an interlayer insulating film, forming contact holes and wiring layers, depositing a protect film, etc. are performed. As a result, the non-volatile semiconductor memory device is completed.

Figure 30:
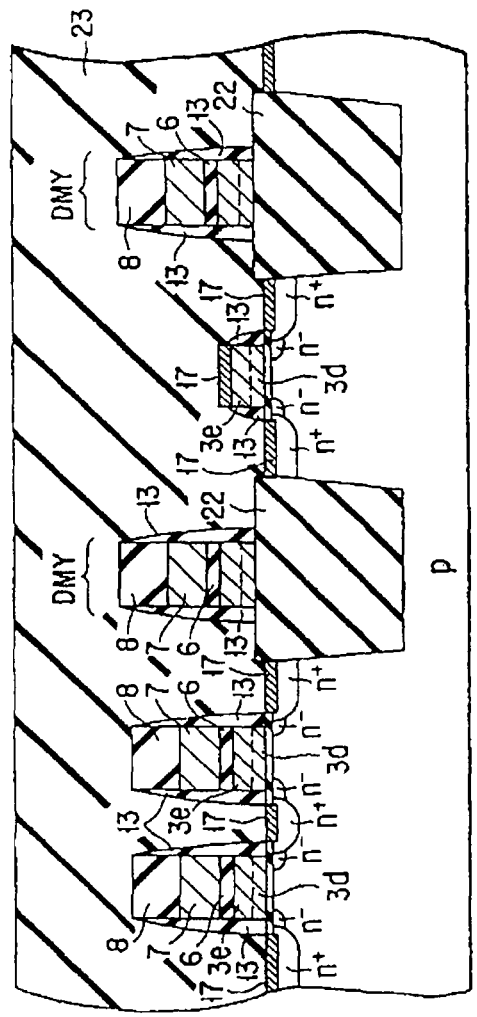
FIG. 30 is a sixth sectional view, showing those essential parts of the non-volatile semiconductor memory device according to the seventh embodiment, which is seen in a process step.
Figure 31:
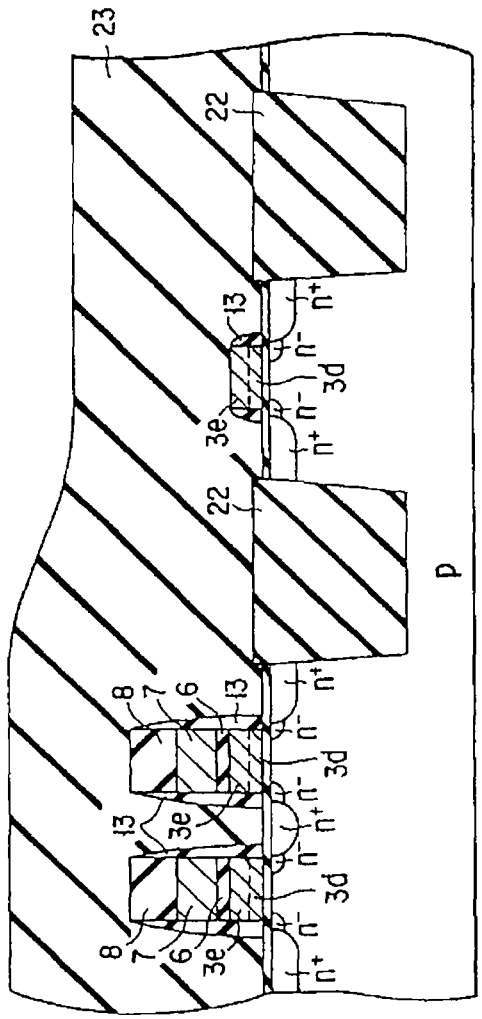
FIG. 31 is a sectional view to be compared with FIG. 30, showing those essential parts of the non-volatile semiconductor memory device according to the seventh embodiment, which is seen in a process step.

FIG. 30 is a sectional view, showing a case where a dummy pattern DMY as shown in FIG. 29 is formed in each element-isolating region adjacent to a corresponding transistor of the peripheral circuit, then an interlayer insulating film 23 is deposited, and the resultant structure is flattened by, for example, CMP. FIG. 31 is a sectional view, useful in explaining the difficulty of the flattening treatment which occurs when the dummy patterns DMY are not formed. As is understood from FIG. 30, the flattening treatment can be performed easily when the dummy patterns DMY are formed in the element-isolating regions adjacent to the transistors of the peripheral circuit.

Although in the above-described embodiments, the invention is applied to a NAND EEPROM, it is not limited to it, but also applicable to an EEPROM of a NOR, DINOR, AND, etc. type. A description will now be given of an EEPROM of such a type.

Figure 32:
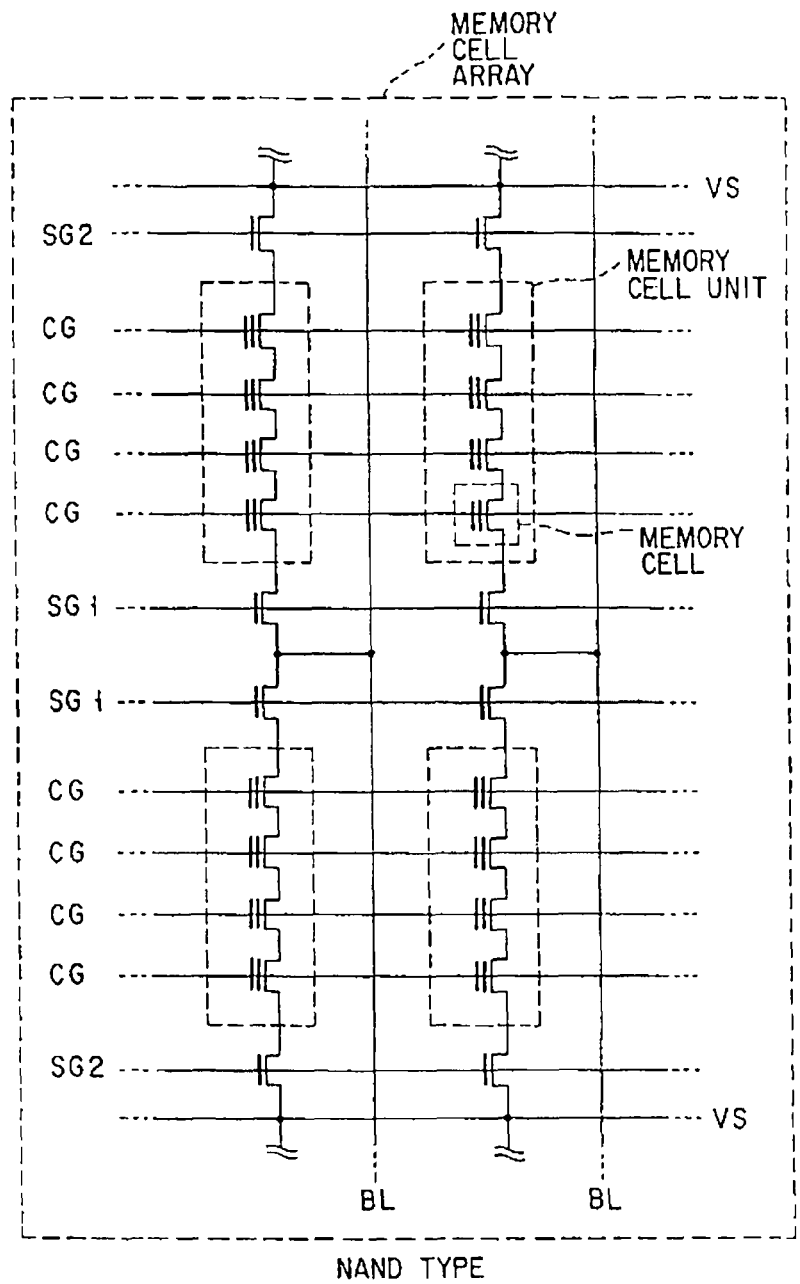
FIG. 32 is a circuit diagram, showing a NAND EEPROM to which each of the embodiments of the invention is applicable.

FIG. 32 is a circuit diagram, showing a memory cell array incorporated in a NAND EEPROM. As is shown in FIG. 32, in the NAND EEPROM, a bit-line-side select gate (SG1), memory cell groups (memory cell units) connected in series, and a source-line-side select gate (SG2) are connected in series between a bit line BL and a source line VS. The select gate of each select transistor denoted by reference sign SG1 or SG2 and the control gate of each memory cell denoted by reference sign CG are connected to the transistors of a peripheral circuit (not shown) for controlling the voltage which is applied for controlling the select transistor and the memory cell.

Figure 33:
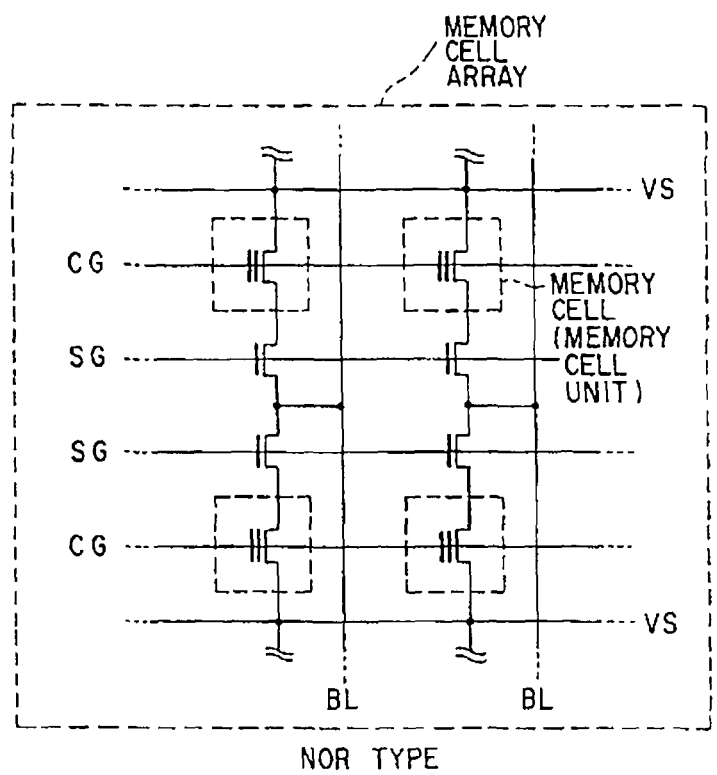
FIG. 33 is a circuit diagram, showing a NOR EEPROM to which each of the embodiments of the invention is applicable.

FIG. 33 is a circuit diagram, showing a memory cell array incorporated in a NOR EEPROM. As is shown in FIG. 33, in the NOR EEPROM, a bit-line-side select gate (SG) and one memory cell are connected in series between a bit line BL and a source line VS perpendicular to the bit line BL. The select gate of each select transistor denoted by reference sign SG and the control gate of each memory cell denoted by reference sign CG are connected to the transistors of a peripheral circuit (not shown) for controlling the voltage which is applied for controlling the select transistor and the memory cell.

Figure 34:
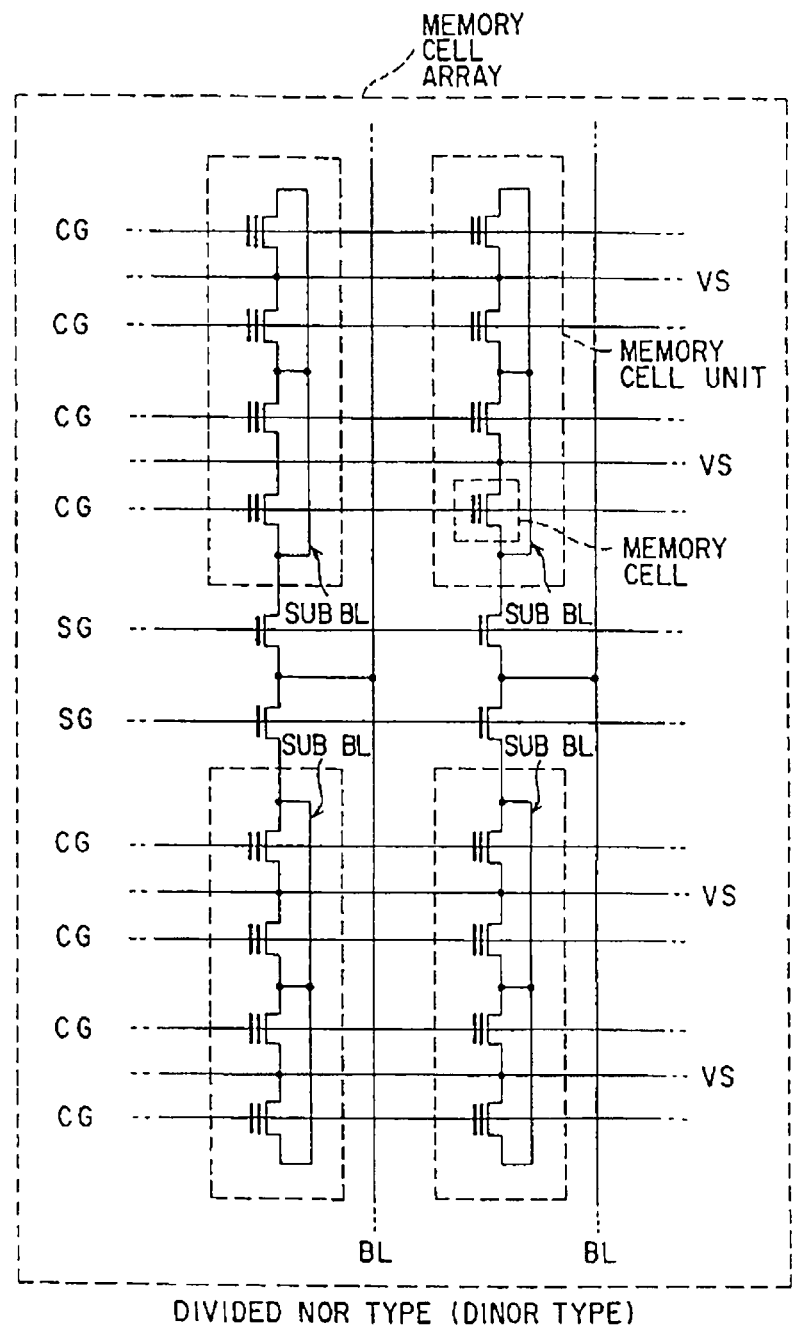
FIG. 34 is a circuit diagram, showing a DINOR EEPROM to which each of the embodiments of the invention is applicable.

FIG. 34 is a circuit diagram, showing a memory cell array incorporated in a DINOR (Divided NOR) EEPROM. As is shown in FIG. 34, in the DINOR EEPROM, memory cells are connected parallel to each other between one sub bit line (sub BL) and a plurality of source lines VS. The sub bit line (sub BL) is connected to a bit line BL via a bit line select gate (SG). The select gate of each select transistor denoted by reference sign SG and the control gate of each memory cell denoted by reference sign CG are connected to the transistors of a peripheral circuit (not shown) for controlling the voltage which is applied for controlling the select transistor and the memory cell.

Figure 35:
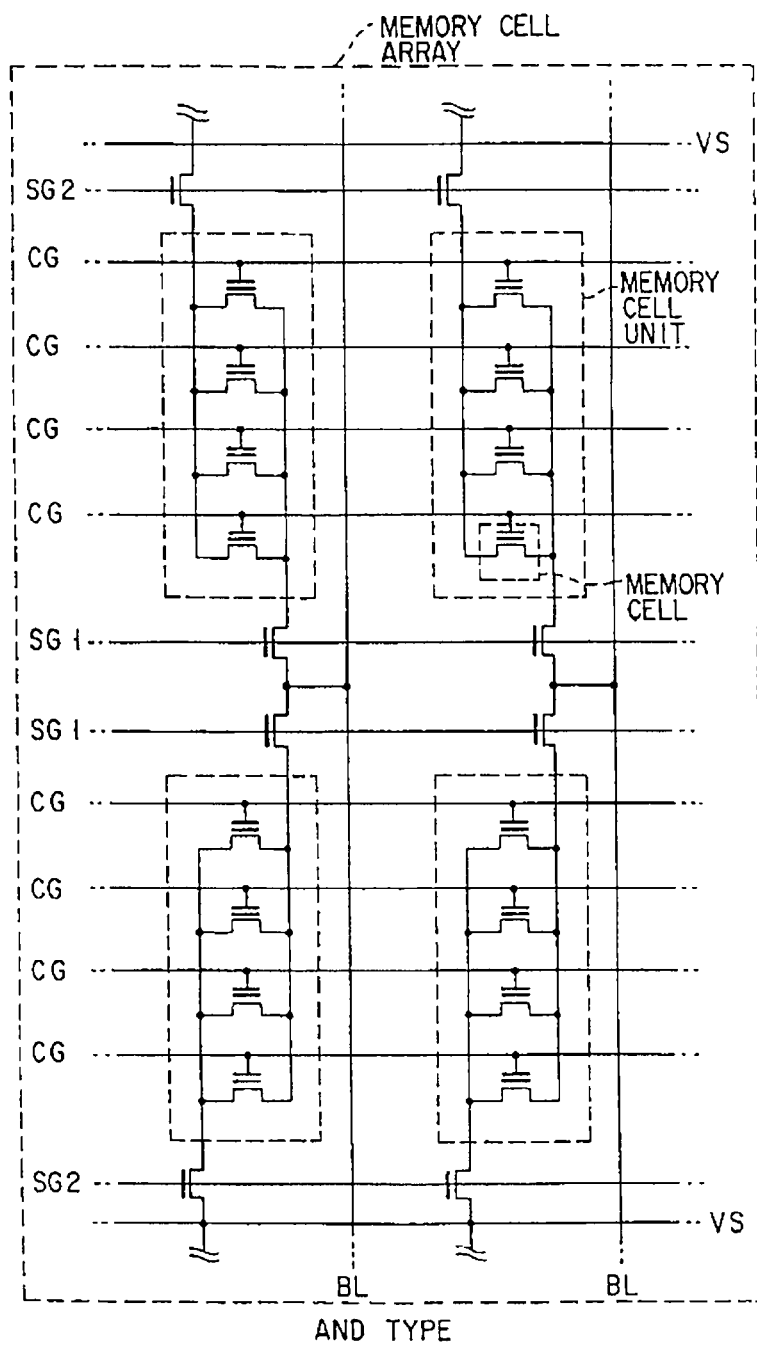
FIG. 35 is a circuit diagram, showing an AND EEPROM to which each of the embodiments of the invention is applicable.

FIG. 35 is a circuit diagram, showing a memory cell array incorporated in an AND EEPROM. As is shown in FIG. 35, in the AND EEPROM, a bit-line-side select gate (SG1), memory cell groups (memory cell units) connected parallel to each other, and a source-line-side select gate (SG2) are connected in series between a bit line BL and a source line VS. The select gate of each select transistor denoted by reference sign SG1 or SG2 and the control gate of each memory cell denoted by reference sign CG are connected to the transistors of a peripheral circuit (not shown) for controlling the voltage which is applied for controlling the select transistor and the memory cell.

As described in each of the embodiments, the non-volatile semiconductor memory devices of the invention are characterized in that gate insulating films of the same kind are intentionally used in order to reduce the manufacturing steps such as the resist forming step, the oxidation step, etc. The devices are also characterized in that the gate electrodes of the peripheral transistors are realized using the first polysilicon layer (floating gate layer), in order to make the transistors have a salicide structure without any complicated step and irrespective of whether a conductive layer (e.g. a WSi layer) is provided on the control gate layer. In other words, as compared with the case where the gate electrodes of the peripheral transistors are formed of the control gate layer, gate oxidation steps for the peripheral transistors can be omitted. Further, since in the invention, an impurity can be implanted simultaneously into the source and drain regions and the gate electrode, the conventional resist patterning and impurity implanting steps, which are performed just for the gate electrodes to produce surface-channel type peripheral transistors, can be omitted. In addition, irrespective of the WSi layer on the control gate layer, the semiconductor memory device can have a polymetal gate structure in which another conductive layer is stacked. These structures enable high speed operation of the peripheral transistors. In addition, in the invention, the first polysilicon layer can be used as a resistive element of a high resistance while the peripheral transistors can be operated at high speed.

As described above, the invention can provide a non-volatile semiconductor memory device which can be manufactured by a simple manufacturing process and hence at low cost, and wherein the transistors of the peripheral circuit of the memory can have a salicide structure and a polymetal gate structure which facilitates the employment of a high-speed CMOS circuit as a peripheral circuit. The invention can also provide a method for manufacturing the non-volatile semiconductor memory device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

The invention claimed is:

1. A non-volatile semiconductor memory device comprising:
    memory cell units each including memory cell transistors each including a stacked gate structure formed by stacking a charge storing layer and a control gate layer above a cell gate insulating film disposed above a first well having a first conductivity type and opposing diffusion layers disposed on the first well to sandwich the stacked gate structure, wherein data is programmed into and erased from the memory cell transistor by charging and discharging the charge storing layer, and select gate transistors adjacent to one of the memory cell units and having a select gate insulating film and a select gate electrode contacting to the select gate insulating film;
    a first transistor having a first gate insulating film and disposed above a second well having a second conductivity type which is opposite to the first conductivity type, and
    a second transistor having a second gate insulating film with a different thickness from the first gate insulating film,
    wherein the cell gate insulating film and the select gate insulating film are formed of substantially the same film, and the charge storing layer and the select gate electrode are formed of substantially the same film, and the memory cell transistors having the same film thickness with respect to the cell gate insulating film thereof, and a thickness of the first gate insulating film is equal to a thickness of the select gate insulating film.

2. The non-volatile semiconductor memory device according to claim 1, wherein the first gate insulating film and the select gate insulating film are formed of substantially the same film.

3. The non-volatile semiconductor memory device according to claim 2, wherein the first transistor has a first gate electrode contacting to the first gate insulating film, and the charge storing layer and the first gate electrode are formed of substantially the same film.

4. The non-volatile semiconductor memory device according to claim 3, wherein the second transistor has a second gate electrode contacting to the second gate insulating film, and the charge storing layer and the second gate electrode are formed of substantially the same film.

5. The non-volatile semiconductor memory device according to claim 4, wherein the second gate insulating film is thicker than the first gate insulating film.

6. The non-volatile semiconductor memory device according to claim 2, wherein the second transistor has a second gate electrode contacting to the second gate insulating film, and the charge storing layer and the second gate electrode are formed of substantially the same film.

7. The non-volatile semiconductor memory device according to claim 2, wherein the second gate insulating film is thicker than the first insulating film.

8. The non-volatile semiconductor memory device according to claim 1, wherein the memory cell transistors are connected in series so as to share one of the diffusion layer with an adjacent one of the memory cell transistors, and each of the diffusion layers of both ends of the memory cell transistors connected in series are shared with one of the plurality of select gate transistors.

9. A non-volatile semiconductor memory device comprising:
    memory cell transistors each including at least one memory cell having a stacked gate structure formed by stacking a charge storing layer and a control gate layer above a cell gate insulating film disposed above a first well having a first conductivity type and opposing diffusion layers disposed on the first well to sandwich the stacked gate structure, wherein data is programmed into and erased from the memory cell by charging and discharging the charge storing layer;
    select gate transistors each sharing one of the diffusion layers with a corresponding one of the memory cell transistors and having a select gate insulating film and a select gate electrode contacting to the select gate insulating film;
    a first transistor having a first gate insulating film and disposed above a second well having a second conductivity type which is opposite to the first conductivity type, and
    a second transistor having a second gate insulating film with a different thickness from the first gate insulating film,
    wherein a thickness of the cell gate insulating film is equal to a thickness of the select gate insulating film, and a thickness of the charge storing layer is equal to a thickness of the select gate electrode, and the memory cell transistors having the same film thickness with respect to the cell gate insulating film thereof and a thickness of the first gate insulating film is equal to a thickness of the select gate insulating film.

10. The non-volatile semiconductor memory device according to claim 9, wherein the first transistor has a first gate electrode contacting to the first gate insulating film, and the thickness of the charge storing layer is equal to a thickness of the first gate electrode.

11. The non-volatile semiconductor memory device according to claim 10, wherein the second transistor has a second gate electrode contacting to the second gate insulating film, and the thickness of the charge storing layer is equal to a thickness of the second gate electrode.

12. The non-volatile semiconductor memory device according to claim 11, wherein the second gate insulating film is thicker than the first insulating film.

13. The non-volatile semiconductor memory device according to claim 9, wherein the second transistor has a second gate electrode contacting to the second gate insulating film, and the thickness of the charge storing layer is equal to a thickness of the second gate electrode.

14. The non-volatile semiconductor memory device according to claim 9, wherein the second gate insulating film is thicker than the first gate insulating film.

15. The non-volatile semiconductor memory device according to claim 9, wherein the memory cell transistors are connected in series so as to share one of the diffusion layer with an adjacent one of the memory cell transistors, and each of the diffusion layers of both ends of the memory cell transistors connected in series are shared with one of the plurality of select gate transistors.

\* \* \* \* \*